US010803910B2

(12) United States Patent
Morita

(10) Patent No.: US 10,803,910 B2
(45) Date of Patent: Oct. 13, 2020

(54) SEMICONDUCTOR STORAGE DEVICE AND READ METHOD THEREOF

(71) Applicant: FUJITSU SEMICONDUCTOR LIMITED, Yokohama-shi, Kanagawa (JP)

(72) Inventor: Keizo Morita, Sagamihara (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 16/509,954

(22) Filed: Jul. 12, 2019

(65) Prior Publication Data
US 2020/0035273 A1 Jan. 30, 2020

(30) Foreign Application Priority Data

Jul. 25, 2018 (JP) .................................. 2018-138970
May 21, 2019 (JP) .................................. 2019-095244

(51) Int. Cl.
G11C 7/06 (2006.01)
G11C 11/22 (2006.01)
G11C 7/12 (2006.01)

(52) U.S. Cl.
CPC .................. G11C 7/06 (2013.01); G11C 7/12 (2013.01); G11C 11/22 (2013.01); G11C 11/2273 (2013.01)

(58) Field of Classification Search
CPC .............. G11C 7/06; G11C 7/12; G11C 11/22
See application file for complete search history.

(56) References Cited

U.S. PATENT DOCUMENTS 5,621,680 A * 4/1997 Newman ................. G11C 11/22
   365/145
5,959,922 A * 9/1999 Jung ....................... G11C 11/22
   365/149
2002/0051376 A1 5/2002 Yamamoto et al.
2007/0035982 A1 2/2007 Yamamura
2007/0147103 A1 6/2007 Yamamura
(Continued)

FOREIGN PATENT DOCUMENTS

JP  2002-133857 A  5/2002
JP  2007-179664 A  7/2007
(Continued)

OTHER PUBLICATIONS

Kawashima et al., "Bitline GND Sensing Technique for Low-Voltage Operation FeRAM", IEEE Journal of Solid-State Circuits, May 2002, vol. 37, No. 5, Cited in Specification. (7 pages).

Primary Examiner — Jay W. Radke
(74) Attorney, Agent, or Firm — Westerman, Hattori, Daniels & Adrian, LLP

(57) ABSTRACT

A first pre-sense amplifier connected to reference cells that hold data of logical value "1" via a first bit line outputs a signal that is obtained by delaying a first amplified signal that is obtained by amplifying a voltage of the first bit line when a memory cell is read. A second pre-sense amplifier connected to memory cells via a second bit line generates a second amplified signal by amplifying a voltage of the second bit line when a memory cell is read. The second pre-sense amplifier receives a signal. When a voltage of the signal reaches a threshold or more, the second pre-sense amplifier drops the voltage of the second bit line to a ground potential.

19 Claims, 25 Drawing Sheets

(56) References Cited

U.S. PATENT DOCUMENTS

| | | | |
|---|---|---|---|
| 2008/0080224 A1 | 4/2008 | Yamamura | |
| 2008/0130347 A1 | 6/2008 | Koide | |
| 2009/0219757 A1* | 9/2009 | Furuta | G11C 7/067 |
| | | | 365/171 |

FOREIGN PATENT DOCUMENTS

| | | |
|---|---|---|
| JP | 2007-220163 A | 8/2007 |
| JP | 2008-90937 A | 4/2008 |
| JP | 2008-140493 A | 6/2008 |

* cited by examiner

SEMICONDUCTOR STORAGE DEVICE AND READ METHOD THEREOF

CROSS-REFERENCE TO RELATED APPLICATIONS

This application is based upon and claims the benefit of priority of the prior Japanese Patent Application No. 2018-138970, filed on Jul. 25, 2018, and the Japanese Patent Application No. 2019-095244, filed on May 21, 2019, the entire contents of which are incorporated herein by reference.

FIELD

The embodiments discussed herein are related to a semiconductor storage device and a read method thereof.

BACKGROUND

There is a semiconductor storage device including memory cells including capacitors. In this semiconductor storage device, the charges accumulated in a capacitor are read to a bit line, and a voltage based on the charge amount is amplified by a sense amplifier.

As a reading technique of a ferroelectric memory, which is one example of the above type of semiconductor storage device, there has been proposed a bit-line GND sense technique in which a voltage needed for reading is ensured even when the power supply voltage is a low voltage. See, for example, Japanese Laid-open Patent Publication No. 2002-133857, and "Bitline GND Sensing Technique for Low-Voltage Operation FeRAM" by Shoichiro Kawashima et al., IEEE Journal of Solid-State Circuits, May 2002, Vol. 37, No. 5, pp. 592-597.

In the bit line GND sense technique, the charges read from a memory cell to a bit line are transferred to a charge accumulation circuit via a charge transfer circuit in such a manner that the potential of the bit line does not fluctuate when a voltage is applied to a plate line. Next, the logical value of the data stored in the memory cell is determined based on the charge amount transferred to the charge accumulation circuit. The charge transfer circuit includes a p-channel type metal-oxide-semiconductor field-effect transistor (MOSFET), which will simply be referred to as a pMOS transistor. The gate-source voltage of the pMOS transistor is initially set to match the threshold voltage of the pMOS transistor before a voltage is applied to a plate line. The gate of the pMOS transistor is controlled by an inverter amplifier that drops the output voltage based on a rise in the voltage of the bit line. In a read operation, the inverter amplifier senses a slight rise in the voltage of the bit line, causes the charges to flow by opening the gate of the pMOS transistor, and sets the voltage of the bit line back to GND (ground potential). The potential difference based on the difference in the charge amount transferred to the charge accumulation circuit between when data of logical value "1" is read and when data of logical value is read is amplified by a sense amplifier, and the logical value is determined.

See, for example, the following documents:
Japanese Laid-open Patent Publication No. 2007-179664
Japanese Laid-open Patent Publication No. 2007-220163
Japanese Laid-open Patent Publication No. 2008-90937
Japanese Laid-open Patent Publication No. 2008-140493

However, recent years have seen a rise in the bit line resistance along with miniaturization of semiconductor storage devices, and the rise in the bit line voltage in a read operation has been decreased. This reduces the potential difference based on the difference in the charge amount transferred to the charge accumulation circuit between when data of logical value "1" is read and when data of logical value "0" is read. As a result, the read margin is reduced. For example, in the bit line GND sense technique, when the rise in the bit line voltage is small in a read operation, the gate of the charge transfer circuit is not sufficiently opened, and the above potential difference is not sufficiently obtained.

SUMMARY

In an aspect, there is provided a semiconductor storage device including: a memory cell which includes a first capacitor that accumulates charges of a first charge amount corresponding to data of a first logical value or data of a second logical value, reading of which causes a voltage of a bit line to change more quickly than reading of the data of the first logical value; a first reference cell which includes a second capacitor that accumulates charges of a second charge amount corresponding to data of the second logical value and which is read with the memory cell when the memory cell is read; a second reference cell which includes a third capacitor that accumulates charges of a third charge amount corresponding to data of the first logical value and which is read with the memory cell when the memory cell is read; a first read circuit which is connected to the first reference cell via a first bit line, generates a first amplified signal by amplifying a first voltage of the first bit line when the memory cell is read, and outputs a stop signal that is obtained by delaying the first amplified signal; a second read circuit which is connected to the second reference cell via a second bit line, generates a second amplified signal by amplifying a second voltage of the second bit line when the memory cell is read, receives the stop signal, and drops the second voltage to a ground potential when a voltage of the stop signal reaches a threshold; a third read circuit which is connected to the memory cell via a third bit line, generates a third amplified signal by amplifying a third voltage of the third bit line when the memory cell is read, receives the stop signal, and drops the third voltage to the ground potential when the voltage of the stop signal reaches the threshold; and a determination circuit which outputs a determination result that is obtained by determining a logical value of data stored in the memory cell based on a potential difference between the first amplified signal and the third amplified signal and a potential difference between the second amplified signal and the third amplified signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Several embodiments will be described below with reference to the accompanying drawings.

First Embodiment

Figure 1:
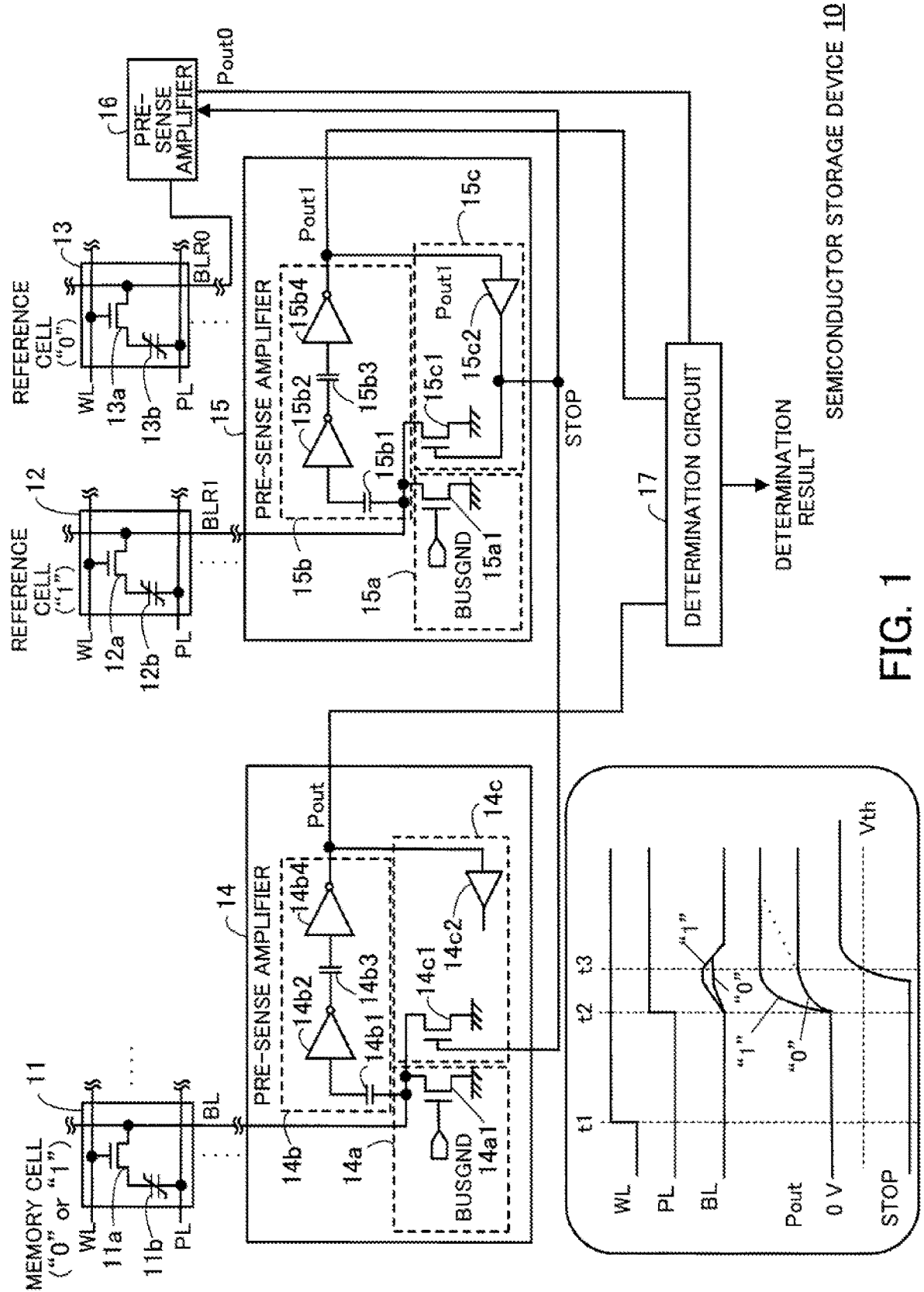
FIG. 1 illustrates an example of a semiconductor storage device according to a first embodiment.

FIG. 1 illustrates an example of a semiconductor storage device according to a first embodiment.

For example, this semiconductor storage device 10 is a ferroelectric random access memory (FeRAM). The semiconductor storage device 10 includes a plurality of memory cells including a memory cell 11, a plurality of reference cells including reference cells 12 and 13, read circuits (which will hereinafter be referred to as pre-sense amplifiers) 14 to 16, and a determination circuit 17. Other components such as a column decoder, a row decoder, etc. of the semiconductor storage device 10 are not illustrated in FIG. 1.

The following description assumes that the reference cells 12 and 13 hold data of logical values "1" and "0", respectively. However, the reference cells 12 and may hold data of the logical values "0", and "1", respectively.

The memory cell 11 includes an n-channel type MOSFET (which will hereinafter be referred to as an nMOS transistor) 11a and a capacitor 11b. The gate of the nMOS transistor 11a is connected to a word line WL. One of the drain and the source of the nMOS transistor 11a is connected to a bit line BL, and the other one of the drain and the source is connected to one end of the capacitor 11b. The other end of the capacitor 11b is connected to a plate line PL.

The reference cell 12 includes an nMOS transistor 12a and a capacitor 12b. The gate of the nMOS transistor 12a is connected to the word line WL. One of the drain and the source of the nMOS transistor 12a is connected to a bit line BLR1, and the other one of the drain and the source is connected to one end of the capacitor 12b. The other end of the capacitor 12b is connected to the plate line PL.

The reference cell 13 includes an nMOS transistor 13a and a capacitor 13b. The gate of the nMOS transistor 13a is connected to the word line WL. One of the drain and the source of the nMOS transistor 13a is connected to a bit line BLR0, and the other one of the drain and the source is connected to one end of the capacitor 13b. The other end of the capacitor 13b is connected to the plate line PL.

When the memory cell 11 is read, the reference cells 12 and 13 are also read.

While not illustrated in FIG. 1, other than the memory cell 11, a plurality of memory cells, each of which is connected to a different word line and plate line, are also connected to the bit line BL. In addition, a plurality of memory cells connected to different word lines and plate lines are also connected to other bit lines. These memory cells have the same configuration as that of the memory cell 11. In addition, other than the reference cells 12 and 13, a plurality of reference cells connected to different word lines and plate lines are connected to the bit lines BLR1 and BLR0. These memory cells have the same configuration as that of the reference cell 12 or 13.

While the following description assumes that the capacitors 11b, 12b, and 13b are ferroelectric capacitors, other capacitors may alternatively be used.

The capacitor 11b in the memory cell 11 holds charges of a charge amount corresponding to data of logical value "0" or "1". In contrast, the capacitor 12b in the reference cell 12 holds charges of a charge amount corresponding to data of logical value "1". In addition, the capacitor 13b in the reference cell 13 holds charges of a charge amount corresponding to data of logical value "0". Reading of the data of logical value "1" causes the voltage of a bit line to change more quickly than reading of the data of logical value "0" does.

The pre-sense amplifier 14 is connected to the memory cell 11 via the bit line BL and generates an amplified signal Pout by amplifying the voltage of the bit line BL when the memory cell 11 is read. In addition, when the pre-sense amplifier 14 drops the voltage of the bit line BL to GND when the voltage of a signal STOP (described later) outputted by the pre-sense amplifier 15 reaches a predetermined threshold or more.

The pre-sense amplifier 14 includes an initialization circuit 14a, an amplifier circuit 14b, and a reset circuit 14c.

The initialization circuit 14a is connected to the bit line BL and drops the voltage of the bit line BL to GND based on a control signal BUSGND. For example, the initialization circuit 14a includes an nMOS transistor 14a1. The gate of the nMOS transistor 14a1 is supplied with the control signal BUSGND. The source of the nMOS transistor 14a1 is connected to ground, and the drain is connected to the bit line BL. The control signal BUSGND is supplied from a timing generation circuit (not illustrated).

The amplifier circuit 14b amplifies the voltage of the bit line BL. For example, the amplifier circuit 14b includes capacitors 14b1 and 14b3 and inverters 14b2 and 14b4. One end of the capacitor 14b1 is connected to the bit line BL, and the other end of the capacitor 14b1 is connected to the input terminal of the inverter 14b2. The output terminal of the inverter 14b2 is connected to one end of the capacitor 14b3, and the other end of the capacitor 14b3 is connected to the input terminal of the inverter 14b4. The output terminal of the inverter 14b4 is connected to the reset circuit 14c. In addition, in the example of the pre-sense amplifier 14 in FIG. 1, the output signal of the inverter 14b4 is the amplified signal Pout, which is an output signal of the pre-sense amplifier 14.

When the voltage of the signal STOP reaches a predetermined threshold or more, the reset circuit 14c drops the voltage of the bit line BL to GND. The reset circuit 14c includes an nMOS transistor 14c1 and a detection circuit 14c2. The gate of the nMOS transistor 14c1 is supplied with the signal STOP. The source of the nMOS transistor 14c1 is connected to ground, and the drain is connected to the bit line BL. The above threshold is the threshold voltage Vth of the nMOS transistor 14c1.

The detection circuit 14c2 in the pre-sense amplifier 14 is not active. The detection circuit 14c2 is arranged to match the load of the pre-sense amplifier 14 and the load of the pre-sense amplifier 15 including a detection circuit 15c2 corresponding to the detection circuit 14c2. However, the pre-sense amplifier 14 may be configured without the detection circuit 14c2.

The other bit lines connected to a plurality of memory cells are also connected to pre-sense amplifiers having the same configuration as that of the pre-sense amplifier 14.

The pre-sense amplifier 15 is connected to the reference cell 12 via the bit line BLR1 and generates an amplified signal Pout1 by amplifying the voltage of the bit line BLR1 when the memory cell 11 is read. In addition, the pre-sense amplifier 15 outputs the signal STOP, which is obtained by delaying the amplified signal Pout1.

As is the case with the pre-sense amplifier 14, the pre-sense amplifier 15 includes an initialization circuit 15a, an amplifier circuit 15b, and a reset circuit 15c. For example, the initialization circuit 15a includes an nMOS transistor 15a1, and the amplifier circuit 15b includes capacitors 15b1 and 15b3 and inverters 15b2 and 15b4. For example, the reset circuit 15c includes an nMOS transistor 15c1 and a detection circuit 15c2.

These circuit elements are connected in the same way as those in the pre-sense amplifier 14, except the reset circuit 15c.

The detection circuit 15c2 in the reset circuit 15c in the pre-sense amplifier 15 outputs the signal STOP, which is obtained by delaying the output signal (amplified signal Pout1) of the amplifier circuit 15b. For example, the detection circuit 15c2 may be configured by using an even number of stages of inverters or delay circuits.

The pre-sense amplifier 16 is connected to the reference cell 13 via the bit line BLR0 and generates an amplified signal Pout0 by amplifying the voltage of the bit line BLR0 when the memory cell 11 is read. The pre-sense amplifier 16 may have the same circuit configuration as that of the pre-sense amplifier 15. In the example of the semiconductor storage device 10 in FIG. 1, the pre-sense amplifier 16 does not output the signal STOP.

The determination circuit 17 outputs a determination result that is obtained by determining the logical value of the data of the memory cell 11 based on the potential difference between the amplified signals Pout and Pout1 and the potential difference between the amplified signals Pout and Pout0.

For example, the determination circuit 17 includes a sense amplifier that amplifies the potential difference between the amplified signals Pout and Pout1 and a sense amplifier that amplifies the potential difference between the amplified signals Pout and Pout0. These two sense amplifiers have output terminals that are short-circuited. The determination circuit 17 determines a determination result by amplifying the larger one of the potential differences more greatly first and subordinating the other sense amplifier.

Hereinafter, an example of a read operation of the semiconductor storage device 10 according to the first embodiment will be described. The following example assumes that the logic level of the control signal BUSGND is a low (L) level. In FIG. 1, how the voltages of the word line WL, the plate line PL, the bit line BL, the amplified signal Pout, and the signal STOP change over time are illustrated.

At timing t1, when a predetermined voltage (a voltage equal to or more than the threshold voltage of the nMOS transistors 11a, 12a, and 13a) is applied to the word line WL, the nMOS transistors 11a, 12a, and 13a are set to an on-state.

Next, at timing t2, when a predetermined voltage (a read voltage) is applied to the plate line PL, the charges based on the charge amount accumulated in the capacitor 11b is read to the bit line BL. As a result, the voltage of the bit line BL rises. In the example in FIG. 1, the case in which data of logical value "1" is stored in the memory cell 11 causes the voltage of a bit line BL to change more quickly than the case in which data of logical value "0" is stored in the memory cell 11 does. When the voltage of the bit line BL rises, the voltage of the amplified signal Pout also rises.

While not illustrated in FIG. 1, the voltage of the amplified signal Pout1 changes in the same way as the voltage of the amplified signal Pout does when data of logical value "1" is stored in the memory cell 11. In addition, the voltage of the amplified signal Pout0 changes in the same way as the voltage of the amplified signal Pout does when data of logical value "0" is stored in the memory cell 11.

Next, when the signal STOP supplied to the pre-sense amplifier 14 reaches the threshold voltage Vth of the nMOS transistor 14c1 (timing t3), the nMOS transistor 14c1 are set to an on-state, and the voltage of the bit line BL drops to GND.

If the nMOS transistor 14c1 remains off, the voltage of the bit line BL continues to rise. In this case, as indicated by a dotted line, the amplified signal Pout rises even after timing t3 also at the time of reading data of logical value "0". When data of logical value "1" is read, since the rise of the amplified signal Pout is saturated at a power supply voltage VDD, the difference in the amplified signal Pout between the two logical values is reduced. As a result, the read margin is reduced. If the resistance of the bit line BL increases along with the miniaturization of the semiconductor storage device 10, the voltage of the bit line BL rises less. Consequently, the difference in the amplified signal Pout between the two logical values is reduced further. Therefore, the determination circuit 17 could fail to obtain an accurate determination result.

In contrast, with the semiconductor storage device 10 according to the first embodiment, since the voltage of the bit line BL drops to GND at timing t3, the rise of the amplified signal Pout stops even when data of logical value "0" is read. Thus, the reduction in the difference in the amplified signal Pout when data of the two logical values is read is prevented, and the reduction in the read margin is prevented. Thus, the reliability of the semiconductor storage device 10 is improved.

In addition, in the example in FIG. 1, the delay time of the signal STOP with respect to the amplified signal Pout1 is set in the detection circuit 15c2 in such a manner that the signal STOP reaches the threshold voltage Vth at the timing at which the amplified signal Pout corresponding to when data of logical value "1" is read is saturated. In this way, the read margin is widened further.

While the above description assumes that the pre-sense amplifier 16 does not output the signal STOP, the pre-sense amplifier 16 may also output the signal STOP, as is the case with the pre-sense amplifier 15. In this case, for example, an OR circuit that outputs a result of an OR operation on the signals STOP outputted by the pre-sense amplifiers 15 and 16 is arranged. This configuration enables the semiconductor storage device 10 to manage a case in which data of logical values "0" and "1" is stored in the reference cells 12 and 13, respectively.

Second Embodiment

Figure 2:
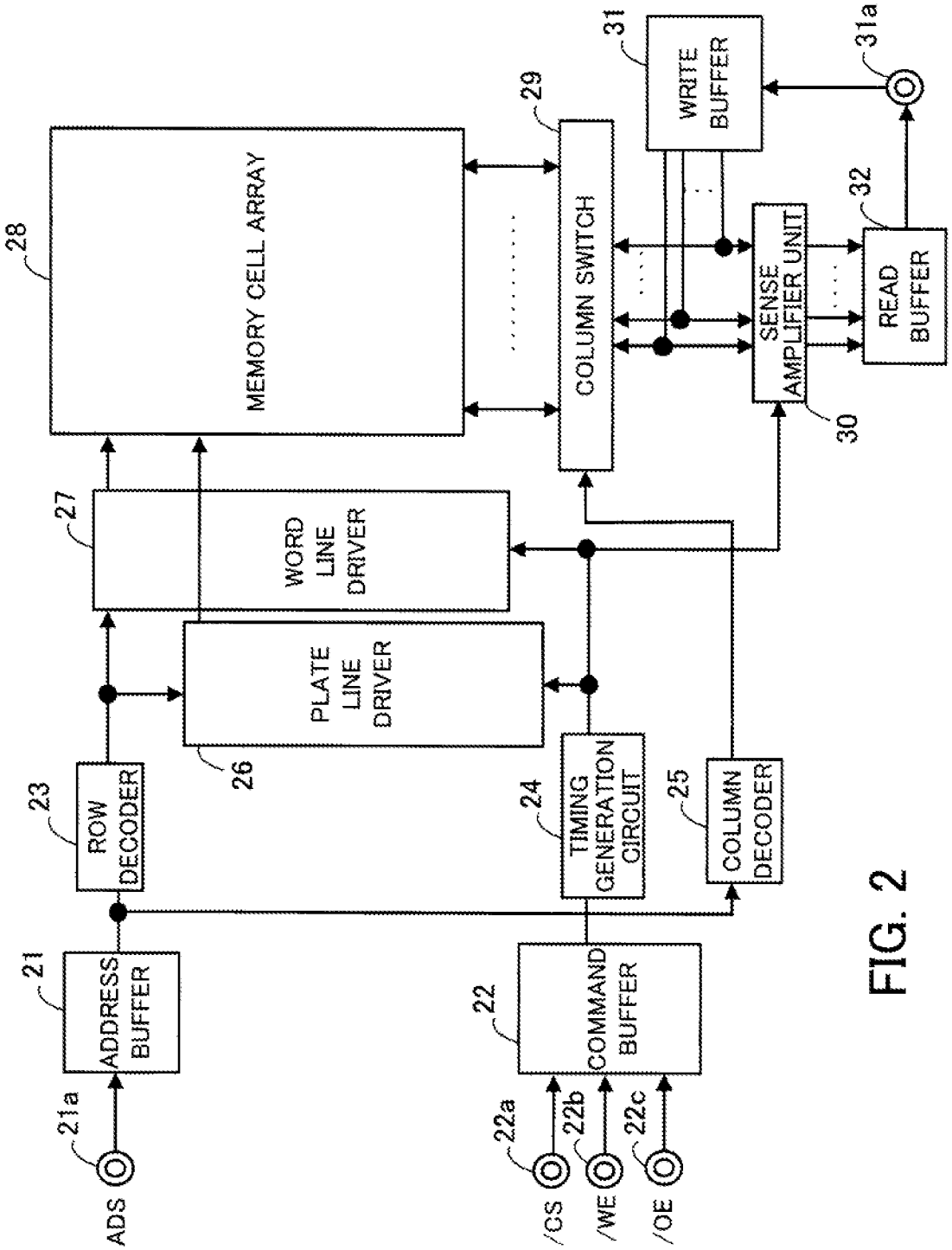
FIG. 2 illustrates an example of a semiconductor storage device according to a second embodiment.

FIG. 2 illustrates an example of a semiconductor storage device according to a second embodiment.

This semiconductor storage device 20 according to the second embodiment includes an address buffer 21, a command buffer 22, a row decoder 23, a timing generation circuit 24, a column decoder 25, a plate line driver 26, and a word line driver 27. The semiconductor storage device 20 also includes a memory cell array 28, a column switch 29, a sense amplifier unit 30, a write buffer 31, and a read buffer 32.

The address buffer 21 receives an address signal ADS supplied from the outside of the semiconductor storage device 20 via an address terminal 21a and supplies the received address signal ADS to the row decoder 23 and the column decoder 25.

The command buffer 22 receives a chip select signal/CS, a write enable signal/WE, and an output enable signal/OE supplied from the outside of the semiconductor storage device 20 via command terminals 22a to 22c. Next, the command buffer 22 supplies the received chip select signal/CS, write enable signal/WE, and output enable signal/OE to the timing generation circuit 24.

The row decoder 23 generates a row decoded signal by decoding a row address included in the address signal ADS (for example, a high-order bit in the address signal ADS) and supplies the generated row decoded signal to the plate line driver 26 and the word line driver 27.

The timing generation circuit 24 decodes an operation mode indicated by the chip select signal/CS, the write enable signal/WE, and the output enable signal/OE. Next, based on the result of the decoding, the timing generation circuit 24 generates various kinds of timing signals for operating the plate line driver 26, the word line driver 27, the sense amplifier unit 30, etc. and supplies the generated timing signals to the corresponding units.

The column decoder 25 generates a column decoded signal by decoding a column address included in the address signal ADS (for example, a low-order bit in the address signal ADS) and supplies the generated column decoded signal to the column switch 29.

The plate line driver 26 applies a predetermined voltage to a plate line specified by the row decoded signal among a plurality of plate lines (not illustrated in FIG. 2) at timing based on the corresponding timing signal for a predetermined period.

The word line driver 27 applies a predetermined voltage to a word line specified by the row decoded signal among a plurality of word lines (not illustrated in FIG. 2) at timing based on the corresponding timing signal for a predetermined period.

Figure 3:
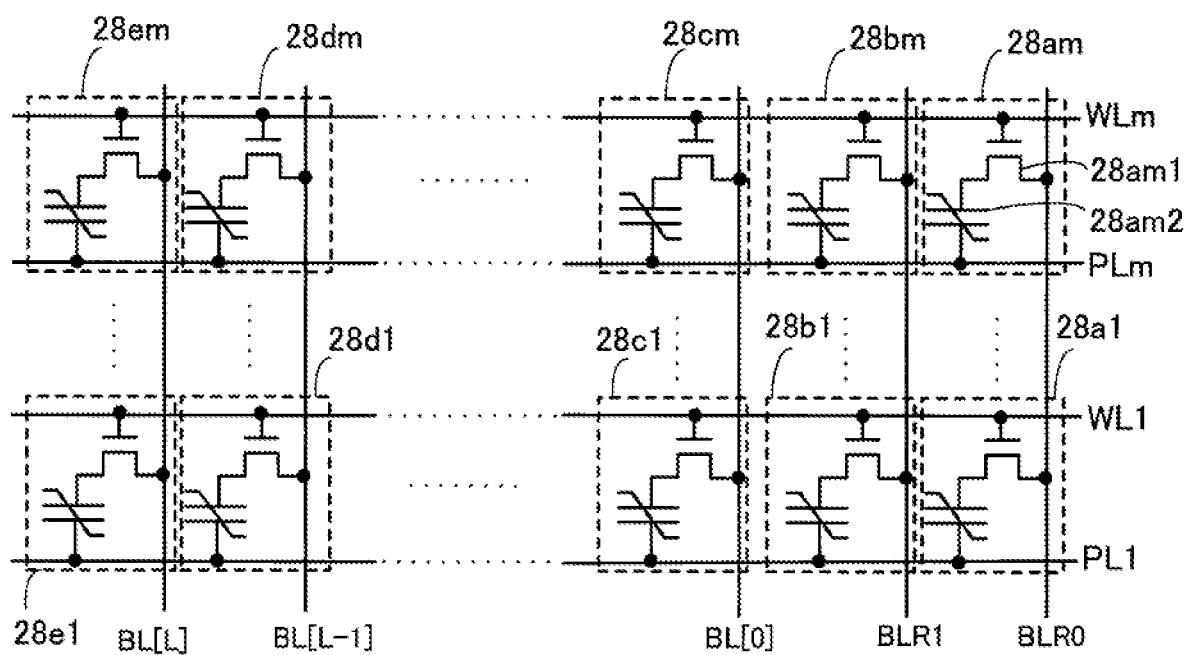
FIG. 3 illustrates an example of a memory cell array.

The memory cell array 28 includes a plurality of memory cells arranged in a matrix, a plurality of bit lines, a plurality of word lines, and a plurality of plate lines (see FIG. 3).

The column switch 29 selects a bit line to be connected to the sense amplifier unit 30 and the write buffer 31 among the plurality of bit lines in the memory cell array 28, based on the column decoded signal.

The sense amplifier unit 30 reads data from the memory cell array 28 at timing based on a plurality of timing signals supplied from the timing generation circuit 24.

The write buffer 31 holds write data supplied via an input-output terminal 31a. The write buffer 31 also has a function of holding data read by the sense amplifier unit 30 for a write back operation.

The read buffer 32 holds read data read from the memory cell array 28 by the sense amplifier unit 30. The read data is outputted to the outside of the semiconductor storage device 20 via the input-output terminal 31a.

FIG. 3 illustrates an example of the memory cell array 28.

The memory cell array 28 includes bit lines BLR0, BLR1, BL[0], . . . , BL[L−1], and BL[L], word lines WL1 to WLm, and plate lines PL1 to PLm. Each of the bit lines BLR0, BLR1, and BL[0] to BL[L] is connected to m memory cells. For example, the bit line BLR0 is connected to memory cells 28a1 to 28am, and the bit line BLR1 is connected to memory cells 28b1 to 28bm. Likewise, the bit line BL[0] is connected to memory cells 28c1 to 28cm, and the bit line BL[L−1] is connected to memory cells 28d1 to 28dm. Likewise, the bit line BL[L] is connected to memory cells 28e1 to 28em.

Each of the memory cells is connected to one of the word lines WL1 to WLm and one of the plates line PL1 to PLm. For example, the memory cells 28am, 28bm, 28cm, 28dm, and 28em are connected to the word line WLm and the plate line PLm, and the memory cells 28a1, 28b1, 28c1, 28d1, and 28e1 are connected to the word line WL1 and the plate line PL1.

Each of the memory cells includes an nMOS transistor (which could be referred to as an access transistor or an access gate) and a capacitor. For example, the memory cell 28am includes an nMOS transistor 28am1 and a capacitor 28am2. The gate of the nMOS transistor 28am1 is connected to the word line WLm. One of the drain and the source of the nMOS transistor 28am1 is connected to the bit line BLR0, and the other one of the drain and the source is connected to one end of the capacitor 28am2. The other end of the capacitor 28am2 is connected to the plate line PLm. The other memory cells have the same circuit configuration as described above.

While the following description will be made assuming that the capacitor included in an individual memory cell is a ferroelectric capacitor, a different capacitor other than a ferroelectric capacitor may alternatively be used.

In this memory cell array 28, for example, each of the memory cells 28a1 to 28am connected to the bit line BLR0 functions as a reference cell that holds data of logical value "0". In addition, each of the memory cells 28b1 to 28bm connected to the bit line BLR1 functions as a reference cell that holds data of logical value "1". The memory cells connected to the other bit lines BL[0] to BL[L] hold data of logical value "0" or "1".

When data is read, L+3 memory cells connected to one of the word lines WL1 to WLm (or the plate lines PL1 to PLm) and connected to the bit lines BLR0, BLR1, and BL[0] to BL[L] are simultaneously selected. Alternatively, N (N≥2) groups of memory cells, each group being formed by L+3 memory cells simultaneously selected as described above, may be connected to each of the word lines WL1 to WLm and the plate lines PL1 to PLm.

Figure 4:
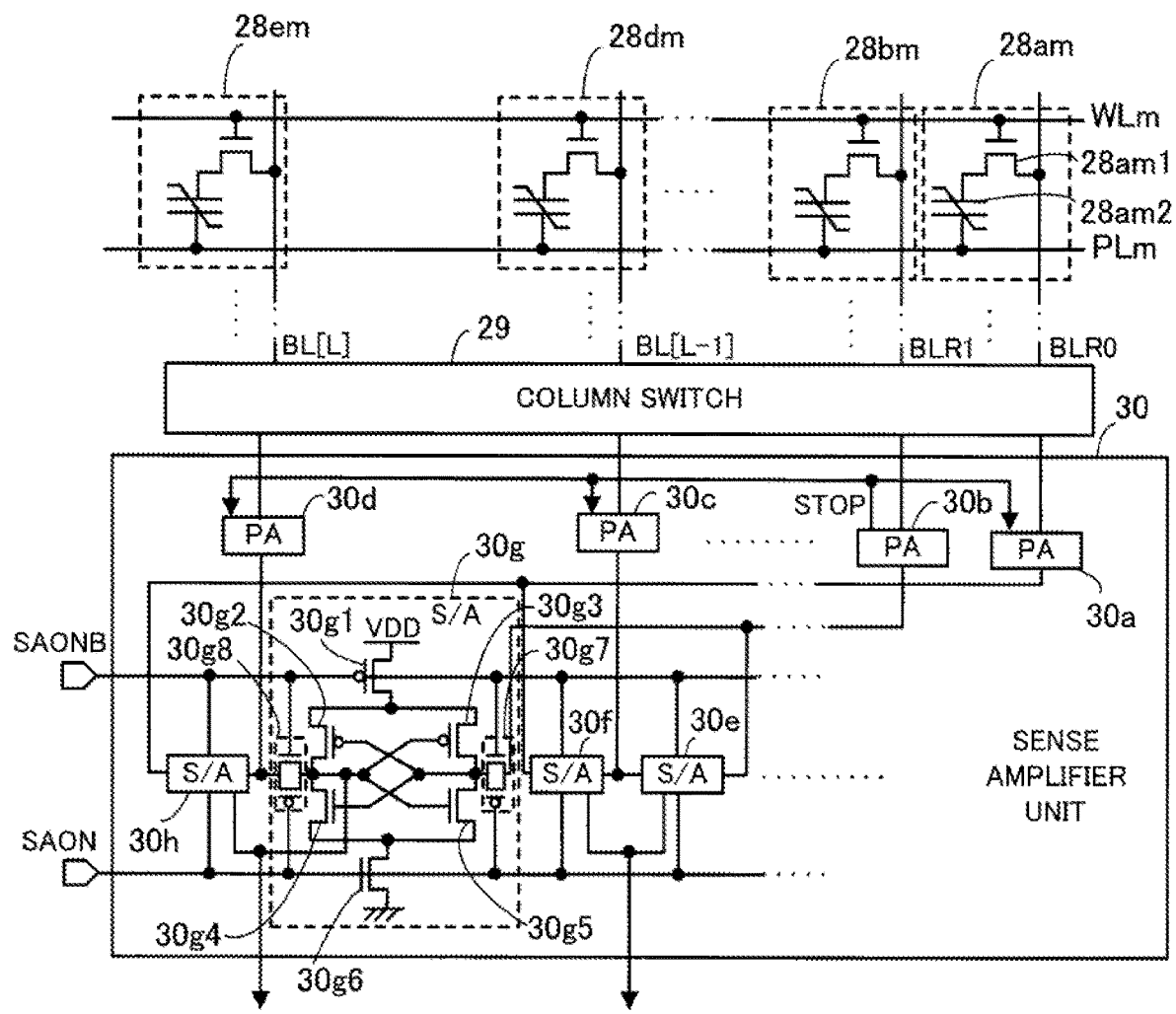
FIG. 4 illustrates an example of a sense amplifier unit.

FIG. 4 illustrates an example of the sense amplifier unit 30.

The sense amplifier unit 30 includes a plurality of pre-sense amplifiers (pre-sense amplifier 30a, 30b, 30c, 30d, etc.) and a plurality of sense amplifiers (sense amplifiers 30e, 30f, 30g, 30h, etc.). In FIG. 4, each of the pre-sense amplifiers is denoted by "PA", and each of the sense amplifiers is denoted by "S/A".

The pre-sense amplifier 30a amplifies the voltage of the bit line BLR0, and the pre-sense amplifier 30b amplifies the voltage of the bit line BLR1. The pre-sense amplifier 30c amplifies the voltage of the bit line BL[L-1], and the pre-sense amplifier 30d amplifies the voltage of the bit line BL[L]. In addition, the pre-sense amplifier 30b supplies a signal STOP to the pre-sense amplifiers 30a, 30c, and 30d.

Each of the sense amplifiers 30e and 30f has a first input terminal. These first input terminals are connected to each other and supplied with an output signal of the pre-sense amplifier 30c. In addition, the sense amplifier 30e has a second input terminal that is supplied with an output signal of the pre-sense amplifier 30b, and the sense amplifier 30f has a second input terminal that is supplied with an output signal of the pre-sense amplifier 30a.

Each of the sense amplifiers 30e and 30f obtains the potential difference between the corresponding two output signals inputted to its own first and second input terminals. One of the sense amplifiers 30e and 30f that has obtained the larger potential difference performs amplification more greatly first, and the other sense amplifier is subordinated. In this way, a determination result of the logical value of the read data is determined.

Each of the sense amplifiers 30g and 30h has a first input terminal. These first input terminals are connected to each other and supplied with an output signal of the pre-sense amplifier 30d. In addition, the sense amplifier 30g has a second input terminal that is supplied with an output signal of pre-sense amplifier 30b, and the sense amplifier 30h has a second input terminal that is supplied with an output signal of the pre-sense amplifier 30a.

Each of the sense amplifiers 30g and 30h obtains the potential difference between the corresponding two output signals inputted to its own first and second input terminals. One of the sense amplifiers 30g and 30h that has obtained the larger potential difference performs amplification more greatly first, and the other sense amplifier is subordinated. In this way, a determination result of the logical value of the read data is determined.

In addition, the sense amplifiers 30e, 30f, 30g, and 30h are supplied with a signal SAON, which is one of the timing signals outputted by the timing generation circuit 24, and a signal SAONB, which is an inverted signal of the signal SAON.

An example of the circuit configuration of the sense amplifier 30g is illustrated in FIG. 4.

The sense amplifier 30g includes pMOS transistors 30g1, 30g2, and 30g3 and nMOS transistors 30g4, 30g5, and 30g6. The sense amplifier 30g also includes switches 30g7 and 30g8, each of which is formed by an nMOS transistor and a pMOS transistor.

The source of the pMOS transistor 30g1 is supplied with a power supply voltage VDD, and the gate of the pMOS transistor 30g1 is supplied with the inverted signal SAONB. The drain of the pMOS transistor 30g1 is connected to the sources of the pMOS transistors 30g2 and 30g3. The drains of the pMOS transistor 30g3 and the nMOS transistor 30g5 are connected to the second input terminal of the sense amplifier 30g via the switch 30g7. The drains of the pMOS transistor 30g3 and the nMOS transistor 30g5 are connected to the gates of the pMOS transistor 30g2 and the nMOS transistor 30g4. The drains of the pMOS transistor 30g2 and the nMOS transistor 30g4 are connected to the first input terminal of the sense amplifier 30g via the switch 30g8. The drains of the pMOS transistor 30g2 and the nMOS transistor 30g4 are connected to the gates of the pMOS transistor 30g3 and the nMOS transistor 30g5. The sources of the nMOS transistors 30g4 and 30g5 are connected to the drain of the nMOS transistor 30g6. The source of the nMOS transistor 30g6 is connected to ground, and the gate of the nMOS transistor 30g6 is supplied with the signal SAON.

The gates of the pMOS transistors of the switches 30g7 and 30g8 are supplied with the signal SAON, and the gates of the nMOS transistors of the switches 30g7 and 30g8 are supplied with the inverted signal SAONB. With the signal SAON and the inverted signal SAONB, the switches 30g7 and 30g8 are set to a conductive state before a sensing operation and to a disconnected state when the sensing operation is started.

The other sense amplifiers have the same circuit configuration as that of the sense amplifier 30g. In each of the sense amplifiers 30g and 30h, a switch having one end connected to its first input terminal (the switch 30g8 in the case of the sense amplifier 30g) has the other end connected to the other switch. Likewise, in each of the sense amplifiers 30e and 30f, a switch having one end connected to its first input terminal has the other end connected to the other switch.

While not illustrated, the sense amplifier unit 30 includes pre-sense amplifiers that amplify the voltages of other bit lines and sense amplifier pairs that determine the logical values of data.

Next, an example of the pre-sense amplifier 30b will be described.

Figure 5:
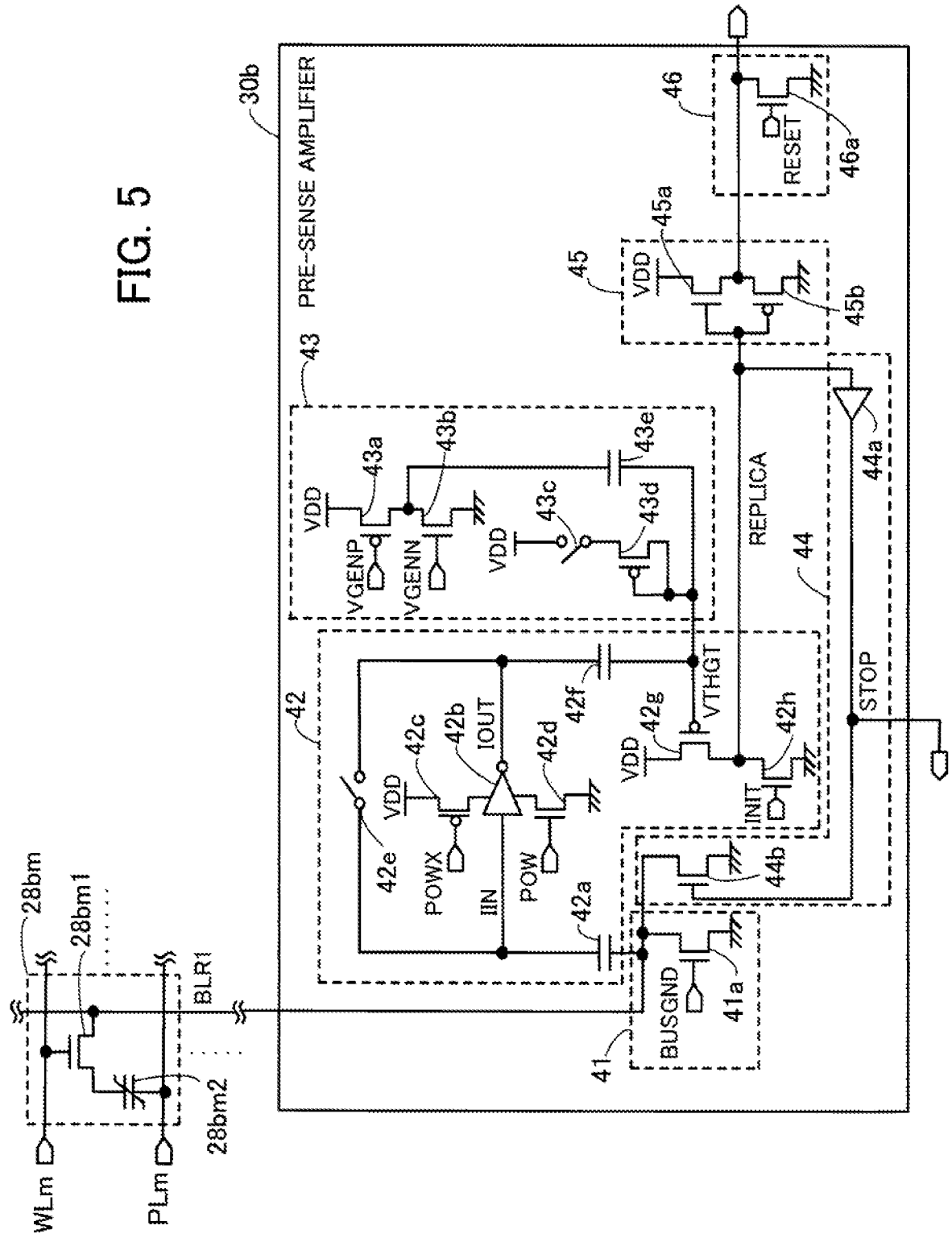
FIG. 5 illustrates an example of a pre-sense amplifier connected to memory cells which function as reference cells that hold data of logical value "1"

FIG. 5 illustrates an example of the pre-sense amplifier 30b connected to memory cells which function as reference cells that hold data of logical value "1".

The pre-sense amplifier 30b is connected to the memory cell 28bm (including the nMOS transistor 28bm1 and the capacitor 28bm2) that functions as a reference cell that holds data of logical value "1" via the bit line BLR1.

The pre-sense amplifier 30b includes an initialization circuit 41, an amplifier circuit 42, a threshold voltage generation circuit 43, a reset circuit 44, a waveform shaping circuit 45, and an output reset circuit 46.

The initialization circuit 41 is connected to the bit line BLR1 and drops the voltage of the bit line BLR1 to GND based on the control signal BUSGND. The initialization circuit 41 includes an nMOS transistor 41a. The gate of the nMOS transistor 41a is supplied with the control signal BUSGND. The source of the nMOS transistor 41a is connected to ground, and the drain of the nMOS transistor 41a is connected to the bit line BLR1. The control signal BUSGND is supplied from the timing generation circuit 24.

The amplifier circuit 42 amplifies the voltage of the bit line BLR1. The amplifier circuit 42 includes capacitors 42a and 42f, an inverter 42b, pMOS transistors 42c and 42g, nMOS transistors 42d and 42h, and a switch 42e.

One end of the capacitor 42a is connected to the bit line BLR1, and the other end of the capacitor 42a is connected to the input terminal of the inverter 42b and one end of the switch 42e. The output terminal of the inverter 42b is connected to one end of the capacitor 42f and the other end of the switch 42e. In addition, the power supply terminal of the inverter 42b is connected to the drain of the pMOS transistor 42c, and the ground terminal of the inverter 42b is connected to the drain of the nMOS transistor 42d. The control signal inputted to the switch 42e is supplied from the timing generation circuit 24.

The power supply voltage VDD is applied to the source of the pMOS transistor 42c, and the gate of the pMOS transistor 42c is supplied with a power control signal POWX. The source of the nMOS transistor 42d is connected to ground, and the gate of the nMOS transistor 42d is supplied with a power control signal POW. The power control signals POWX and POW are mutually complementary signals and supplied from the timing generation circuit 24.

The other end of the capacitor 42f is connected to the gate of the pMOS transistor 42g and the threshold voltage generation circuit 43. The power supply voltage VDD is applied to the source of the pMOS transistor 42g, and the drain of the pMOS transistor 42g is connected to the drain of the nMOS transistor 42h, the reset circuit 44, and the waveform shaping circuit 45. The voltages of the drains of the pMOS transistor 42g and the nMOS transistor 42h represent an output signal REPLICA of the amplifier circuit 42. The source of the nMOS transistor 42h is connected to ground, and the gate of the nMOS transistor 42h is supplied with a signal INIT. The circuit formed by the pMOS transistor 42g and the nMOS transistor 42h functions as an inverter. The signal INIT is supplied from the timing generation circuit 24.

The threshold voltage generation circuit 43 generates a gate voltage VTHGT of the pMOS transistor 42g, which is equal to the threshold voltage of the pMOS transistor 42g. The threshold voltage generation circuit includes pMOS transistors 43a and 43d, an nMOS transistor 43b, a switch 43c, and a capacitor 43e.

The power supply voltage VDD is applied to the source of the pMOS transistor 43a, and the gate of the pMOS transistor 43a is supplied with a voltage control signal VGENP. In addition, the drain of the pMOS transistor 43a is connected to the drain of the nMOS transistor 43b and one end of the capacitor 43e. The gate of the nMOS transistor 43b is supplied with a voltage control signal VGENN, and the source of the nMOS transistor 43b is connected to ground. The power supply voltage VDD is applied to one end of the switch 43c, and the other end of the switch 43c is connected to the source of the pMOS transistor 43d. The gate and drain of the pMOS transistor 43d and the other end of the capacitor 43e are connected to the gate of the pMOS transistor 42g in the amplifier circuit 42. The voltage control signals VGENP and VGENN and the control signal supplied to the switch 43c are supplied from the timing generation circuit 24.

The reset circuit 44 outputs the signal STOP and drops the voltage of the bit line BLR1 to GND when the voltage of the signal STOP reaches a predetermined threshold or more. The reset circuit 44 includes a detection circuit 44a and an nMOS transistor 44b. The detection circuit 44a outputs the signal STOP that is obtained by delaying the output signal REPLICA of the amplifier circuit 42. The detection circuit 44a may be configured by using an even number of stages of inverters or delay circuits, for example. The gate of the nMOS transistor 44b is supplied with the signal STOP. The source of the nMOS transistor 44b is connected to ground, and the drain of the nMOS transistor 44b is connected to the bit line BLR1.

The waveform shaping circuit 45 shapes the waveform of the output signal REPLICA of the amplifier circuit 42. The waveform shaping circuit 45 includes an nMOS transistor 45a and a pMOS transistor 45b. The power supply voltage VDD is applied to the drain of the nMOS transistor 45a, and the drain of the pMOS transistor 45b is connected to ground. The gates of the nMOS transistor 45a and the pMOS transistor 45b are supplied with the output signal REPLICA. In addition, the voltage of the drain of the nMOS transistor 45a and the voltage of the source of the pMOS transistor 45b, the drain and source being connected to each other, represent the output signal of the waveform shaping circuit 45.

The output reset circuit 46 drops the voltage of the output signal of the pre-sense amplifier 30b to GND based on a reset signal RESET. The output reset circuit 46 includes an nMOS transistor 46a. The gate of the nMOS transistor 46a is supplied with the reset signal RESET. The source of the nMOS transistor 46a is connected to ground, and the drain of the nMOS transistor 46a is connected to the output terminal of the waveform shaping circuit 45. The reset signal RESET is supplied from the timing generation circuit 24.

The pre-sense amplifier 30a illustrated in FIG. 4 has the same circuit configuration as that of the pre-sense amplifier 30b illustrated in FIG. 5. However, the pre-sense amplifier 30a of the semiconductor storage device 20 according to the second embodiment may be configured not to output the signal STOP. Alternatively, as is the case with the pre-sense amplifier 30b, the pre-sense amplifier 30a may be configured to output the signal STOP. In the latter case, a logic circuit (not illustrated) performs logic synthesis on the signals STOP outputted by the pre-sense amplifiers 30a and 30b and distributes the result to the other pre-sense amplifiers.

Figure 6:
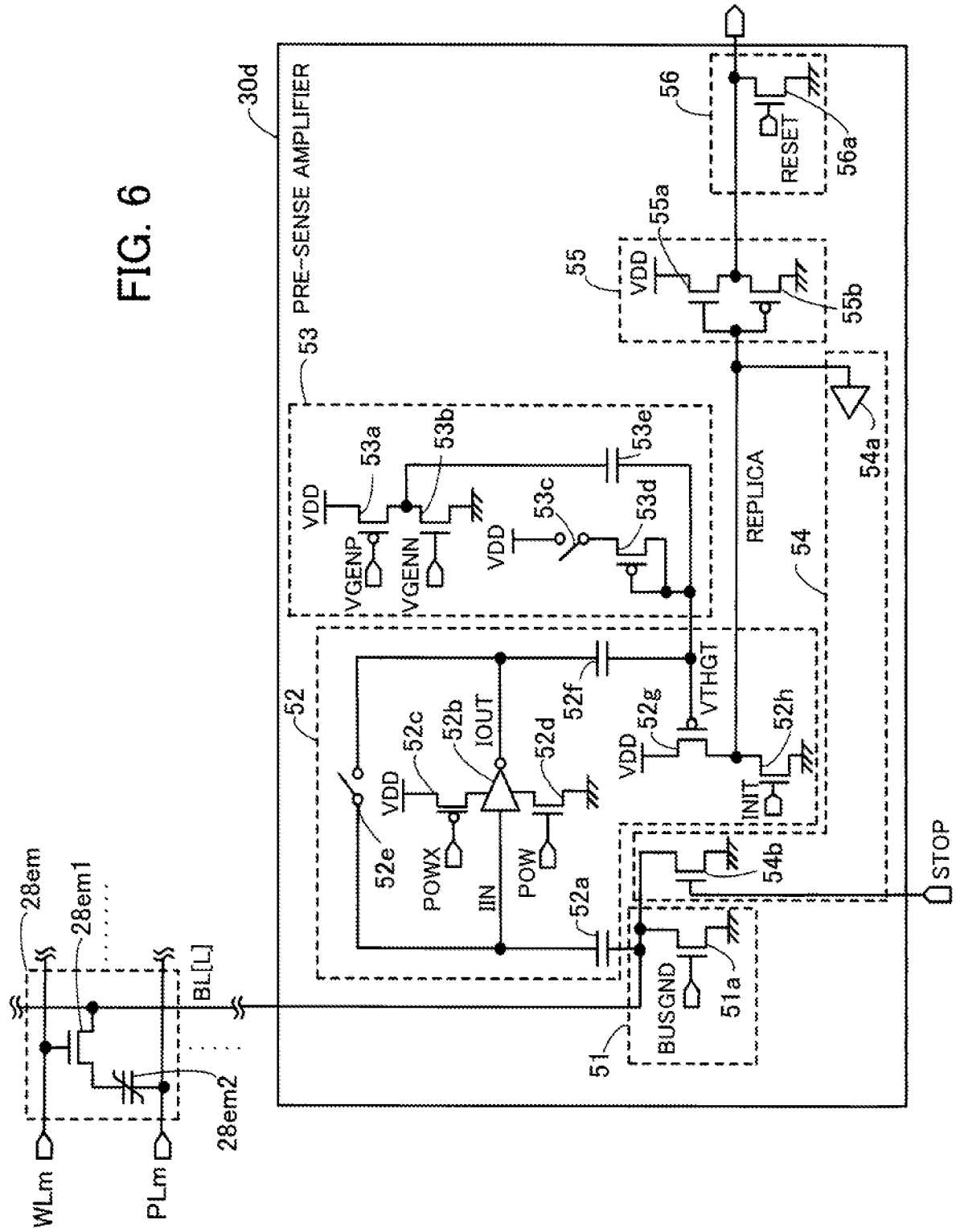
FIG. 6 illustrates an example of a pre-sense amplifier connected to memory cells that hold data of logical value "0" or "1"

FIG. 6 illustrates an example of the pre-sense amplifier 30d connected to memory cells that hold data of logical value "0" or "1".

In the example in FIG. 6, the pre-sense amplifier 30d is connected to the memory cell 28em (including an nMOS transistor 28em1 and a capacitor 28em2) via the bit line BL[L].

As is the case with the pre-sense amplifier 30b illustrated in FIG. 5, the pre-sense amplifier 30d includes an initialization circuit 51, an amplifier circuit 52, a threshold voltage generation circuit 53, a reset circuit 54, a waveform shaping circuit 55, and an output reset circuit 56.

The initialization circuit 51 includes an nMOS transistor 51a, and the amplifier circuit 52 includes a capacitors 52a and 52f, an inverter 52b, pMOS transistors 52c and 52g, nMOS transistors 52d and 52h, and a switch 52e. The threshold voltage generation circuit 53 includes pMOS transistors 53a and 53d, an nMOS transistor 53b, a switch 53c, and a capacitor 53e, and the reset circuit 54 includes a detection circuit 54a and an nMOS transistor 54b. The waveform shaping circuit 55 includes an nMOS transistor 55a and a pMOS transistor 55b, and the output reset circuit 56 includes an nMOS transistor 56a.

The circuit elements are connected in the same way as those in the pre-sense amplifier 30b, except the reset circuit 54.

The gate of the nMOS transistor 54b of the reset circuit 54 in the pre-sense amplifier 30d is supplied with the signal STOP from the pre-sense amplifier 30b. In addition, the detection circuit 54a of the reset circuit 54 in the pre-sense amplifier 30d is not active. The detection circuit 54a is arranged to match the load of the pre-sense amplifier 30d and the load of the pre-sense amplifier 30b. However, the pre-sense amplifier 30d may alternatively be configured without the detection circuit 54a.

Next, an example of a read operation of the semiconductor storage device 20 according to the second embodiment will be described.

Figure 7:
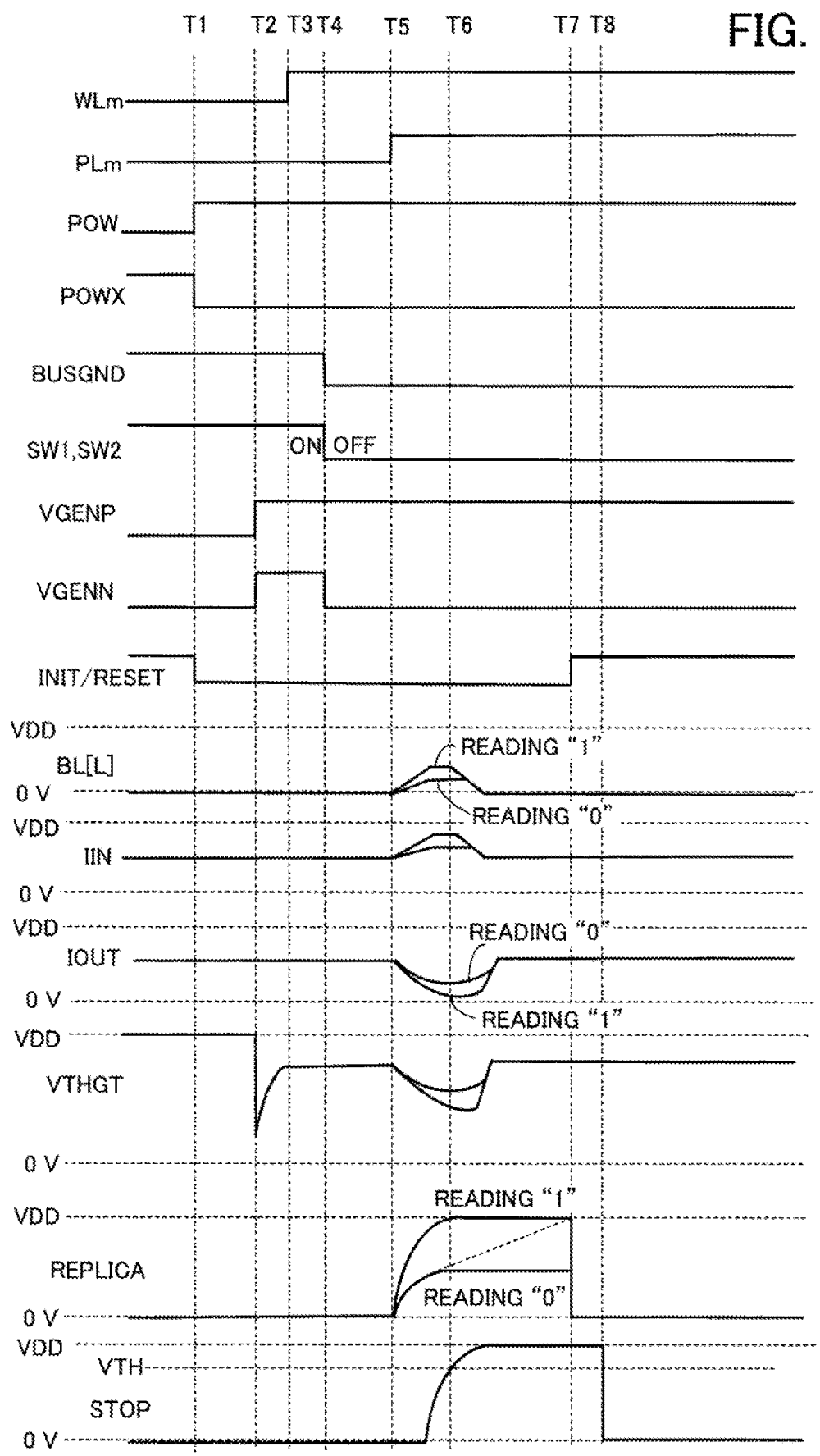
FIG. 7 is a timing chart illustrating an example of a read operation of the semiconductor storage device according to the second embodiment.

FIG. 7 is a timing chart illustrating an example of a read operation of the semiconductor storage device 20 according to the second embodiment.

In FIG. 7, examples of how the voltages of the word line WLm, the plate line PLm, the power control signals POW and POWX, the control signal BUSGND, the control signals SW1 and SW2 inputted to the switches 52e and 53c, and the voltage control signals VGENP and VGENN change over time are illustrated. In FIG. 7, how the voltages of the signal INIT, the reset signal RESET, and the bit line BL[L], the input voltage IIN of the inverter 52b, the output voltage IOUT of the inverter 52b, the gate voltage VTHGT, the output signal REPLICA, and the signal STOP change over time are also illustrated. The following description assumes that the ground potential is 0 V.

First, in an initial state, both of the voltages of the word line WLm and the plate line PLm are at an L level (for example, 0 V). In addition, the logic level of the power control signal POW is at an L level, and the logic level of the power control signal POWX is at an H level (for example, the power supply voltage VDD). Since the pMOS transistor 52c and the nMOS transistor 52d are both in an off-state, the inverter 52b is not active. In addition, the logic level of the control signal BUSGND is at an H level, and the nMOS transistor 51a is in an on-state. Thus, the voltage of the bit line BL[L] is 0 V.

Based on the control signals SW1 and SW2, the switches 52e and 53c are in an on-state. In addition, since both the logic levels of the voltage control signals VGENP and VGENN are at an L level, the pMOS transistor 53a is in an on-state, and the nMOS transistor 53b is in an off-state. Both of the logic levels of the signal INIT and the reset signal RESET are set at an H level, and the nMOS transistors 52h and 56a are in an on-state. Thus, the output signal REPLICA and the output signal (not illustrated) of the pre-sense amplifier 30d are 0 V.

Since the input terminal and the output terminal of the inverter 52b are short-circuited, both of the input voltage IIN and the output voltage IOUT are about ½ of the power supply voltage VDD. In addition, the gate voltage VTHGT is equal to the power supply voltage VDD, and the signal STOP supplied from the pre-sense amplifier 30b to the pre-sense amplifier 30d is 0 V.

At timing T1, when the logic level of the power control signal POW changes to an H level and when the logic level of the power control signal POWX changes to an L level, the inverter 52b is activated. Since the switch 52e remains in an on-state, both of the input voltage IIN and the output voltage IOUT of the inverter 52b are about VDD/2. In addition, at timing T1, both the logic levels of the signal INIT and the reset signal RESET change to an L level, and the nMOS transistors 52h and 56a are set to an off-state.

At timing T2, when both of the logic levels of the voltage control signals VGENP and VGENN change to an H level, the drain voltages of the pMOS transistor 53a and the nMOS transistor 53b drop. This voltage change causes capacitive coupling of the capacitor 53e and drops the gate voltage VTHGT. For example, when the power supply voltage VDD is 1.8 V, if the drain voltages of the pMOS transistor 53a and the nMOS transistor 53b drop by 1.8 V, the gate voltage VTHGT also begins to drop by 1.8 V.

However, since the switch 53c is in an on-state, the pMOS transistor 53d functions as a clamp circuit and clamps the gate voltage VTHGT at the threshold voltage of the pMOS transistor 52g (for example, VDD—0.6 V). Thus, after dropping to some extent, the gate voltage VTHGT rises back to the threshold voltage, forming a differentiated waveform. In this way, the threshold voltage generation circuit 53 functions as an initialization circuit that sets the gate voltage VTHGT to a predetermined voltage.

At timing T3, when a predetermined voltage (for example, the power supply voltage VDD) is applied to the word line WLm, the nMOS transistor 28em1 of the memory cell 28em connected to the word line WLm is set to an on-state, and the data is set to be readable.

At timing T4, when the logic level of the voltage control signal VGENN changes to an L level, the nMOS transistor 53b of the threshold voltage generation circuit 53 is set to an off-state. Since the pMOS transistor 53a has already been in an off-state, the drains of the pMOS transistor 53a and the nMOS transistor 53b are set to a floating state.

At timing T4, the switches 52e and 53c are also set to an off-state. Since the switch 52e is set to an off-state, the short-circuiting of the input terminal and the output terminal of the inverter 52b is canceled. Since the input voltage IIN of the inverter 52b is about VDD/2, the inverter 52b operates as an inversion amplifier having a high gain. In addition, since the switch 53c is set to an off-state, the pMOS transistor 53d cancels the clamping of the gate voltage VTHGT.

In addition, at timing T4, the logic level of the control signal BUSGND changes to an L level, and the bit line BL[L] is set to a floating state. As a result, if the voltage of the bit line BL[L] changes after timing T4, the input voltage IIN of the inverter 52b changes based on capacitive coupling of the capacitor 52a. The inverter 52b amplifies the change of the input voltage IIN and changes the output voltage IOUT in the opposite direction to the change of the input voltage IIN. In addition, based on capacitive coupling of the capacitor 52f, the gate voltage VTHGT changes with the change of the output voltage IOUT.

At timing T5, a predetermined voltage (for example, the power supply voltage VDD) is applied to the plate line PLm. The predetermined voltage has already been applied to the word line WLm at timing T3, and the nMOS transistor 28em1 of the memory cell 28em has already been in an on-state. Thus, when the predetermined voltage is applied to the plate line PLm, a positive voltage is applied to the capacitor 28em2.

When data of logical value "1" is stored in the memory cell 28em, since the polarity of the voltage applied to the capacitor 28em2, which is a ferroelectric capacitor, is opposite to the polarity when the data is written, polarization reversal occurs. As a result, a large number of reverse charges are read to the bit line BL[L]. In contrast, when data of logical value "0" is stored in the memory cell 28em, the polarity of the voltage applied to the capacitor 28em2 is the same as the polarity when the data is written, polarization reversal does not occur. As a result, a relatively small number of charges are read to the bit line BL[L]. At this point, the voltage of the bit line BL[L] begins to rise. When the voltage of the bit line BL[L] has slightly risen, the input voltage IIN of the inverter 52b rises based on capacitive coupling of the capacitor 52a. The inverting amplification effect of the inverter 52b and the capacitive coupling of the capacitor 52f drop the gate voltage VTHGT and set the pMOS transistor 52g to an on-state. As a result, the voltage of the output signal REPLICA begins to rise. As described above, the pMOS transistor 52g functions as a read circuit that generates a read voltage based on the charges accumulated in the memory cell 28em.

When the data in the memory cell 28em is read, the data in the other memory cells connected to the word line WLm is also read simultaneously. The voltage of the output signal REPLICA in the pre-sense amplifier 30b connected to the memory cell 28bm of all these memory cells rises more quickly than the voltages of the output signals REPLICA in the pre-sense amplifiers connected to any other memory cells that hold data of logical value "0". In addition, the pre-sense amplifier 30b outputs the signal STOP that is obtained by delaying the output signal REPLICA.

In the example in FIG. 7, when data of logical value "1" is read, the voltage of the signal STOP reaches the threshold voltage VTH of the nMOS transistor 54b at timing T6 in which the output signal REPLICA is saturated. As a result, the nMOS transistor 54b is set to an on-state, the voltage of the bit line BL[L] beings to drop to 0 V, and the output signal REPLICA stops to rise.

Next, at timing T7, since the logic levels of the signal INIT and the reset signal RESET change to an H level, the output signal REPLICA and the output signal (not illustrated) of the pre-sense amplifier 30d are reset to 0 V. As a result, after a predetermined period of time, the logic level of the signal STOP also changes to an L level (timing T8).

For example, the timing generation circuit 24 receives the signal STOP, and supplies, when the logic level of the signal STOP is at an H level, the signal SAON and the inverted signal SAONB that enable the sense amplifiers 30g, 30h, etc. to the sense amplifier unit 30. With this configuration, between timing T6 and T7, the read data is determined by the sense amplifiers 30g, 30h, etc.

If the nMOS transistor 54b remained off even after the above timing T6, the voltage of the bit line BL[L] would continue to rise, and as indicated by a dotted line, the output signal REPLICA would rise even after the data of logical value "0" is read. When data of logical value "1" is read, since the rise of the output signal REPLICA is saturated at the power supply voltage VDD, the difference in the output signal REPLICA between two logical values would be reduced, and the read margin would be reduced. Thus, an accurate determination result could not be obtained in the data determination processing by using the sense amplifiers 30g and 30h.

In contrast, in the case of the semiconductor storage device 20 according to the second embodiment, since the voltage of the bit line BL[L] drops to 0 V at timing T6, the rise of the output signal REPLICA stops even when data of logical value "0" is read. Thus, the reduction in the difference in the output signal REPLICA obtained when data of the two logical values is read is prevented, and the reduction in the read margin is consequently prevented. Therefore, the reliability of the semiconductor storage device 20 is improved.

Third Embodiment

Next, a semiconductor storage device according to a third embodiment will be described. The semiconductor storage device according to the third embodiment includes pre-sense amplifiers different from those of the semiconductor storage device 20 according to the second embodiment.

Figure 8:
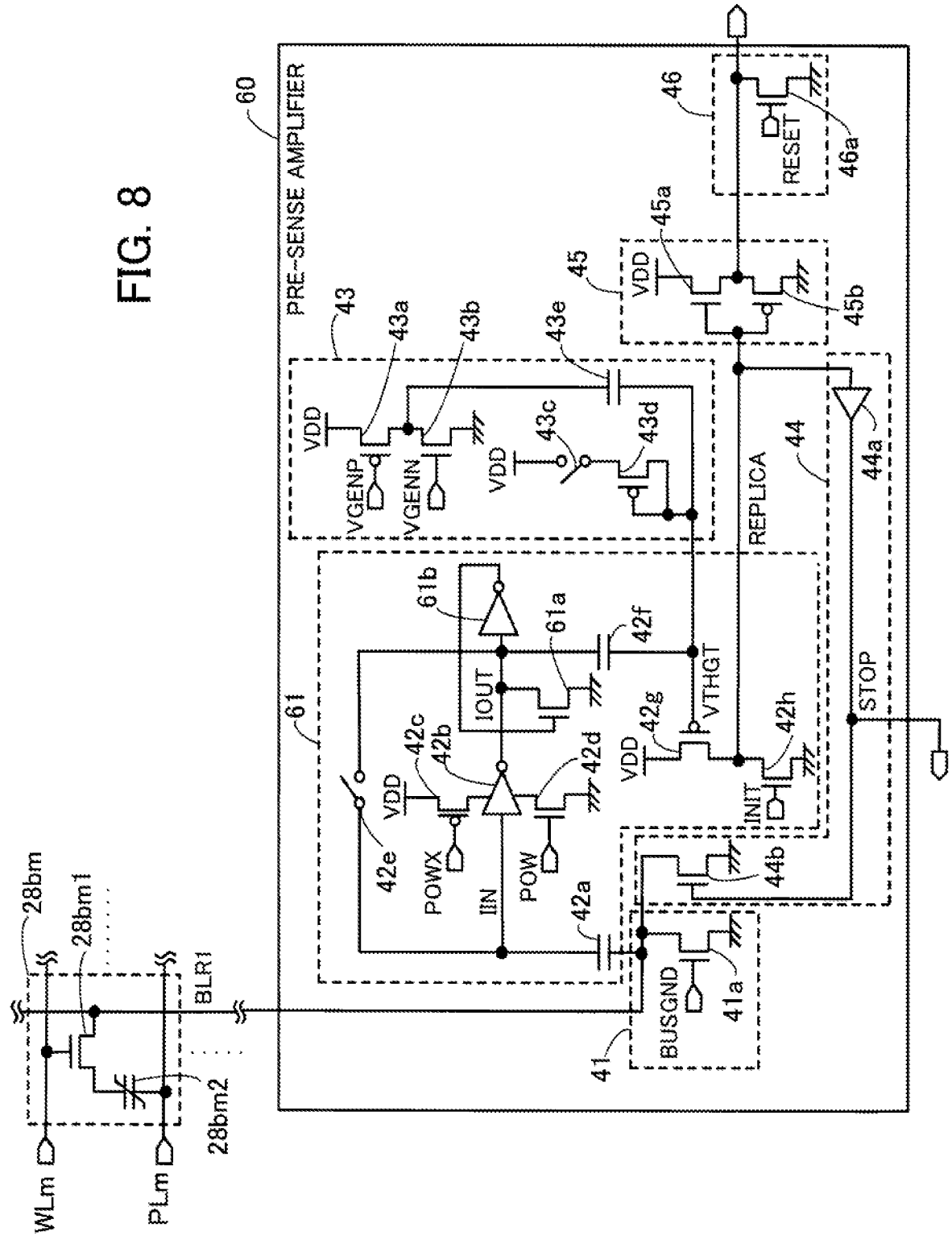
FIG. 8 illustrates an example of a pre-sense amplifier of a semiconductor storage device according to a third embodiment, the pre-sense amplifier being connected to memory cells which function as reference cells that hold data of logical value "1"

FIG. 8 illustrates an example of a pre-sense amplifier 60 of the semiconductor storage device according to the third embodiment, the pre-sense amplifier 60 being connected to memory cells which function as reference cells that hold data of logical value "1".

Figure 9:
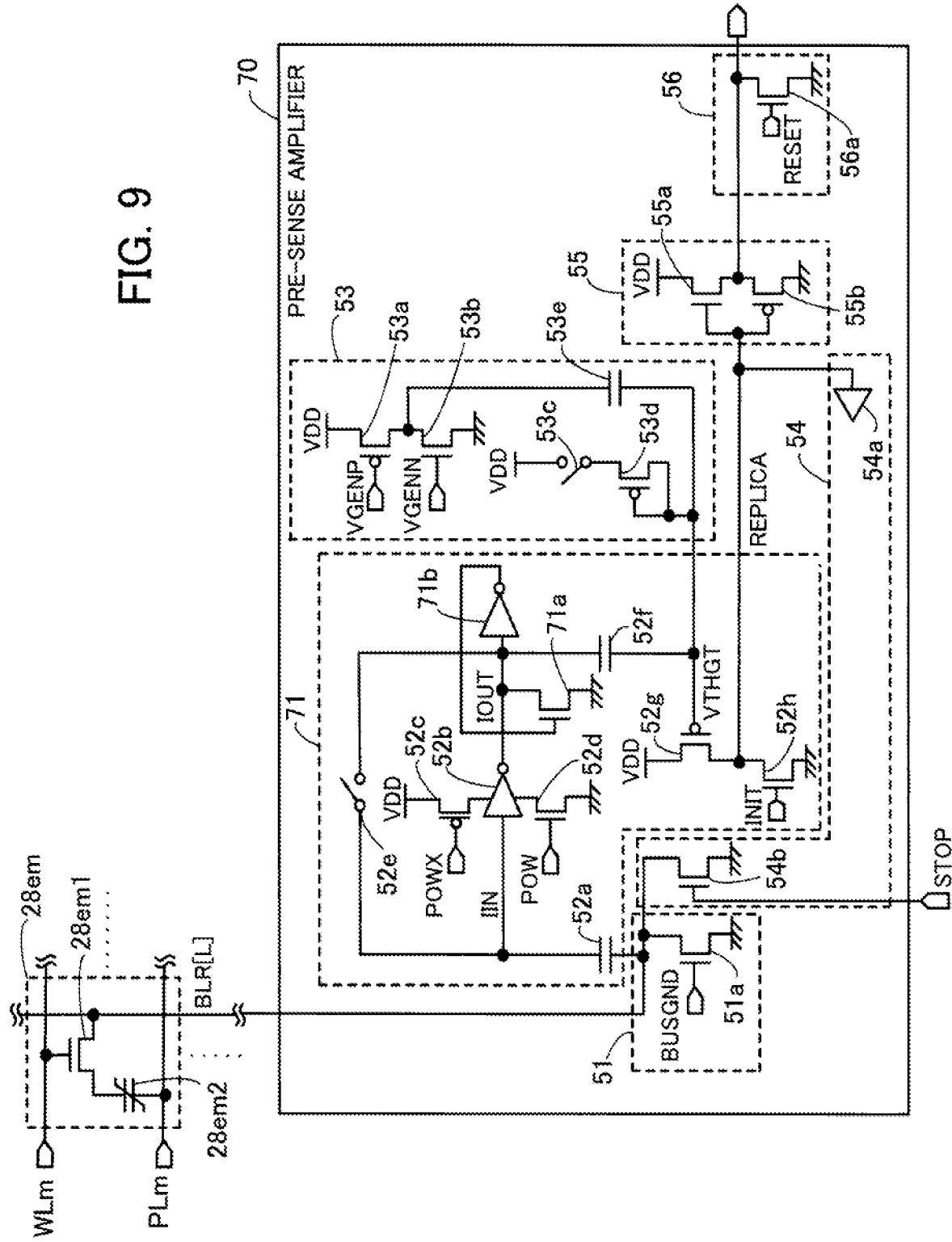
FIG. 9 illustrates an example of a pre-sense amplifier of the semiconductor storage device according to the third embodiment, the pre-sense amplifier being connected to memory cells that hold data of logical value "0" or "1"

FIG. 9 illustrates an example of a pre-sense amplifier 70 of the semiconductor storage device according to the third embodiment, the pre-sense amplifier 70 being connected to memory cells that hold data of logical value "0" or "1". In FIGS. 5, 6, 8, and 9, like reference characters refer to like elements.

Amplifier circuits 61 and 71 in the pre-sense amplifiers 60 and 70 illustrated in FIGS. 8 and 9 are different from the amplifier circuits 42 and 52 in the pre-sense amplifiers 30b and 30d of the semiconductor storage device 20 according to the second embodiment. The amplifier circuit 61 in FIG. 8 includes an nMOS transistor 61a and an inverter 61b in addition to the elements included in the amplifier circuit 42. Likewise, the amplifier circuit 71 in FIG. 9 includes an nMOS transistor 71a and an inverter 71b in addition to the elements included in the amplifier circuit 52.

In the amplifier circuit 61 in FIG. 8, the drain of the nMOS transistor 61a is connected to the output terminal of an inverter 42b and the input terminal of the inverter 61b, and the source of the nMOS transistor 61a is connected to ground. The gate of the nMOS transistor 61a is connected to the output terminal of the inverter 61b.

In amplifier circuit 71 in FIG. 9, the drain of the nMOS transistor 71a is connected to the output terminal of an inverter 52b and the input terminal of the inverter 71b, and the source of the nMOS transistor 71a is connected to ground. In addition, the gate of the nMOS transistor 71a is connected to the output terminal of the inverter 71b.

Since the amplifier circuits 61 and 71 include the nMOS transistors 61a and 71a and the inverters 61b and 71b, the output voltages IOUT of the inverters 42b and 52b drops more quickly.

Figure 10:
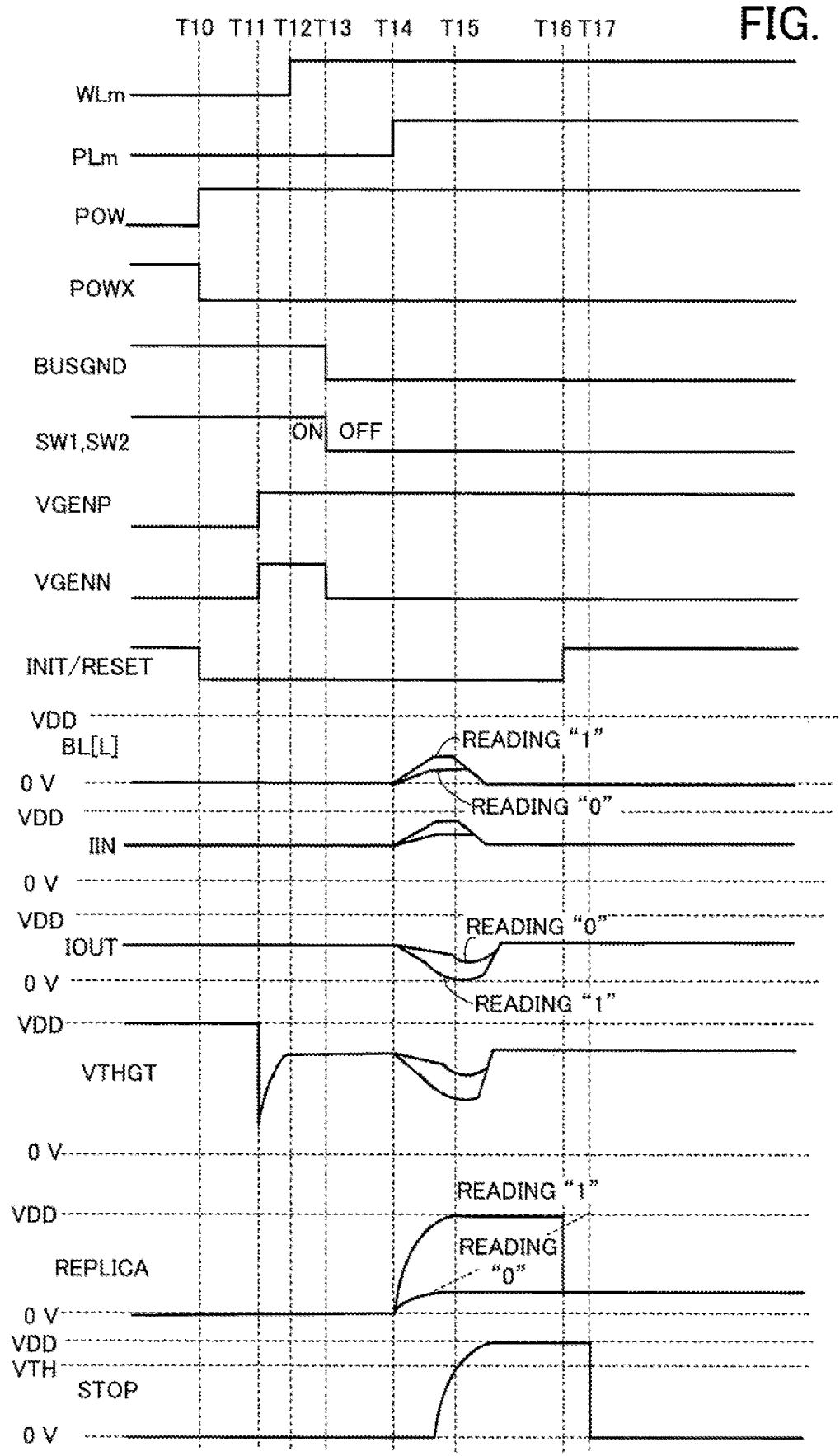
FIG. 10 is a timing chart illustrating an example of a read operation of the semiconductor storage device according to the third embodiment.

FIG. 10 is a timing chart illustrating an example of a read operation of the semiconductor storage device according to the third embodiment.

The operations at timing T10, T11, T12, and T13 are the same as those at timing T1 to T4 in the case of the semiconductor storage device 20 illustrated in FIG. 7.

At timing T14, based on the rise of the input voltage IIN, the inverter 42b in the amplifier circuit 61 in FIG. 8 drops the output voltage IOUT more quickly than the inverter 42b of the semiconductor storage device 20 according to the second embodiment.

As a result, the output signal REPLICA rises more quickly than that of the semiconductor storage device 20 according to the second embodiment. Thus, the signal STOP reaches the threshold voltage VTH at timing T15 more quickly than that of the semiconductor storage device 20 according to the second embodiment. In this way, even when data of logical value "0" is read, the rise of the output signal REPLICA stops more quickly. Thus, the difference in the output signal REPLICA when data of the two logical values is read is increased further, and the read margin is widened further.

The operations at timing T16 and T17 are the same as those at timing T7 and T8 in the case of the semiconductor storage device 20 illustrated in FIG. 7.

Write-Back Method

Since a semiconductor storage device such as a FeRAM or a dynamic random access memory (DRAM) loses data stored in memory cells when performing a read operation, the semiconductor storage device performs a write-back operation after the read operation.

For example, when data of logical value "0" is written back to the memory cell 28em illustrated in FIG. 3, a voltage (for example, the power supply voltage VDD) for writing the data of logical value "0" is applied to the plate line PLm, and the voltage of the bit line BL[L] is set to 0 V. As illustrated in FIG. 7 (or FIG. 10), in the case of a read operation of the semiconductor storage device 20 according to the second embodiment (or the semiconductor storage device according to the third embodiment), when the voltage of the signal STOP reaches the threshold voltage VTH, the voltage of the bit line BL[L] begins to drop to 0 V. Even after this timing, since the plate line driver 26 continues to apply the power supply voltage VDD, which is equal to the voltage for writing data of logical value "0", to the plate line PLm, the read period and the write-back period for the data of logical value "0" are allowed to overlap. Thus, the time needed for the write-back operation is shortened.

After the data of logical value "0" is written in the memory cell in which the data of logical value "1" has been stored, read data determination processing is performed, and data of logical value "1" is written back to the memory cell.

The data determination result that has been obtained by the sense amplifiers 30g and 30h is stored in the write buffer 31 illustrated in FIG. 2, and a write-back operation of the data of logical value 1 is performed based on the determination result stored in the write buffer 31. Thus, the write buffer 31 functions as a write circuit.

Figure 11:
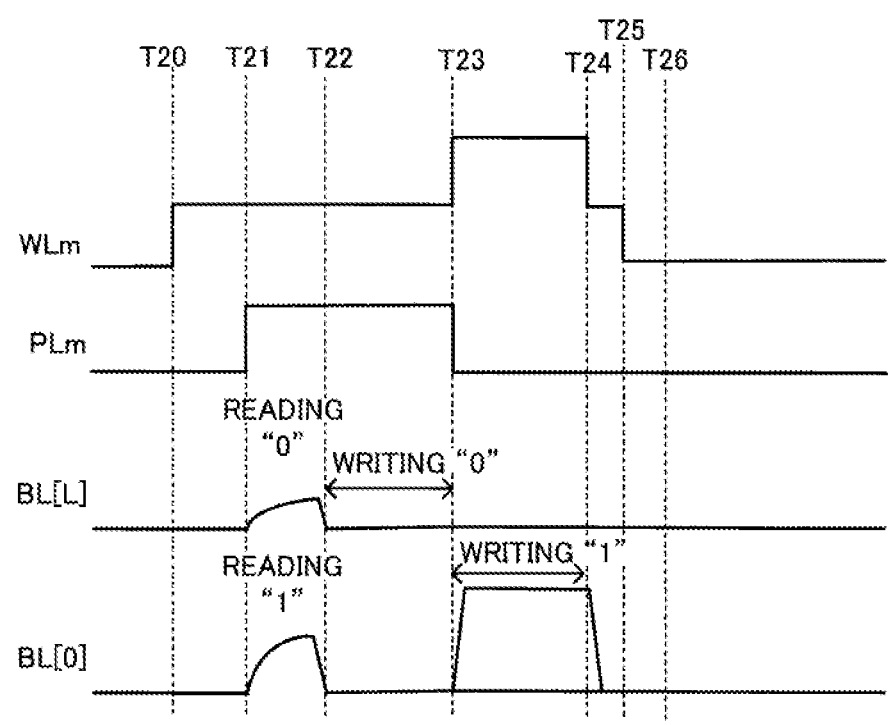
FIG. 11 is a timing chart illustrating examples of changes of voltages of a word line, a plate line, and bit lines in a write-back operation.

FIG. 11 is a timing chart illustrating examples of changes of voltages of a word line, a plate line, and bit lines in a write-back operation.

FIG. 11 illustrates data read and write-back examples when data of logical value "0" is stored in the memory cell 28em and data of logical value "1" is stored in the memory cell 28cm in the memory cell array 28 illustrated in FIG. 3.

First, the power supply voltage VDD is applied to the word line WLm (timing T20). Next, the power supply voltage VDD is also applied to the plate line PLm (timing T21). As a result, the voltages of the bit lines BL[L] and BL[0] rise based on the respective data stored in the memory cells 28em and 28cm. However, as illustrated in FIGS. 7 and 10, the voltages of the bit lines BL[L] and BL[0] begin to drop to 0 V when the signal STOP reaches the threshold voltage VTH (timing T22).

At this point, since the power supply voltage VDD is continuously applied to the plate line PLm, data of logical value "0" is written in the memory cells 28em and 28cm. In addition, since the same data is written back to the memory cell 28cm in which data of logical value "1" has been stored, a voltage higher than the power supply voltage VDD is applied to the word line WLm, and the power supply voltage VDD is applied to the bit line BL[0] at timing T23. In contrast, the voltage of the plate line PLm is dropped to 0 V. As a result, data of logical value "1" is written back to the memory cell 28cm.

In the above processing, even when the data determination processing using the sense amplifiers is performed between timing T22 and T23, this period between timing T22 and T23 is used as the write-back period for the data of logical value "0". As a result, the time needed for the write-back operation is shortened.

Fourth Embodiment

Figure 12:
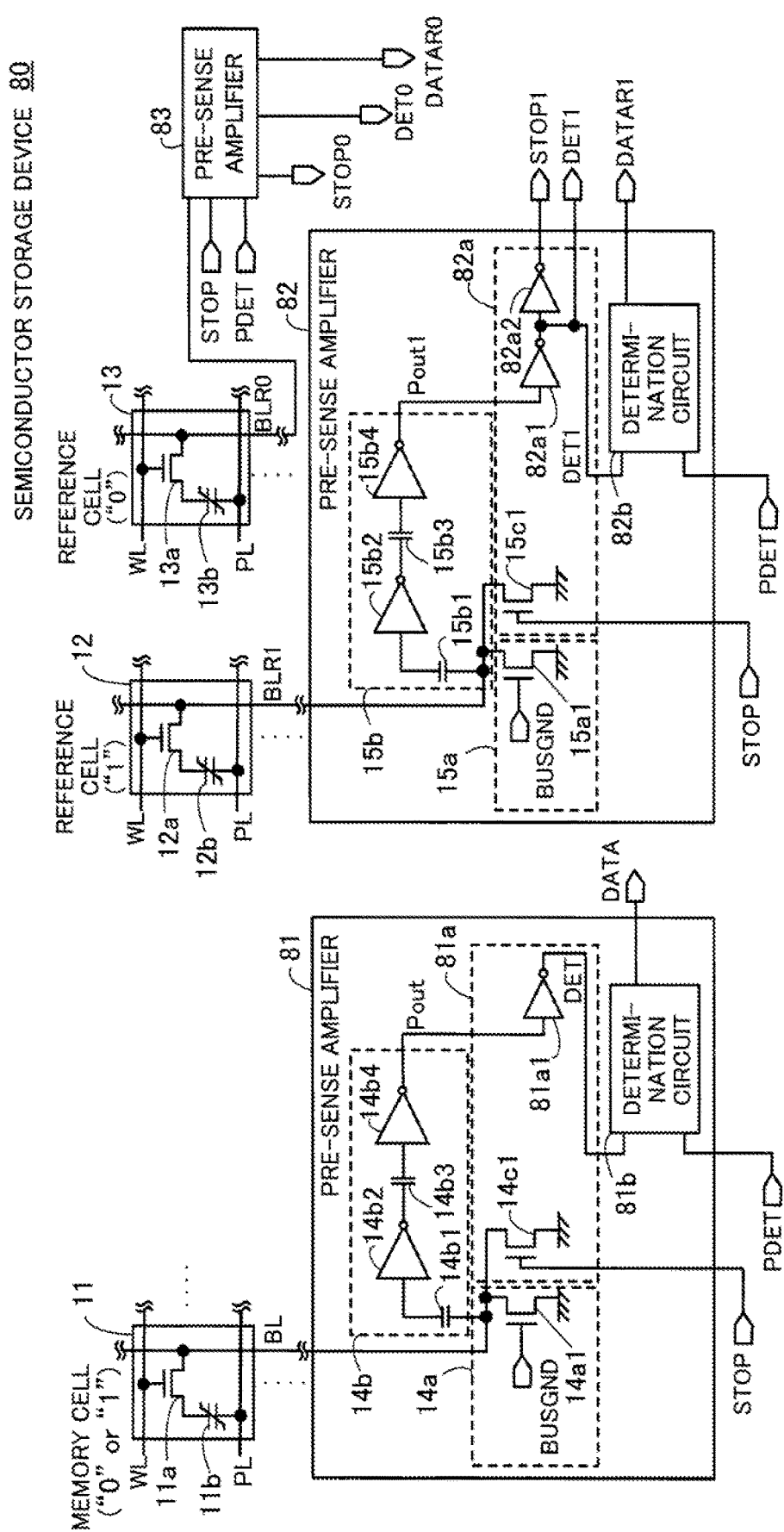
FIG. 12 illustrates an example of a semiconductor storage device according to a fourth embodiment.

FIG. 12 illustrates an example of a semiconductor storage device 80 according to a fourth embodiment. In FIGS. 1 and 12, like reference characters refer to like elements.

The semiconductor storage device 80 according to the fourth embodiment does not include the determination circuit 17, unlike the semiconductor storage device 10 according to the first embodiment. In addition, pre-sense amplifiers 81 to 83 in the semiconductor storage device 80 are different from the pre-sense amplifiers 14 to 16 in the semiconductor storage device 10.

In a reset circuit 81a in the pre-sense amplifier 81 connected to the memory cell 11 via the bit line BL, a detection circuit 81a1 is an inverter, for example. When the voltage of the amplified signal Pout rises and reaches a predetermined threshold, the logic level of a detection signal DET outputted by the detection circuit 81a1 changes from an H level to an L level.

In addition, the pre-sense amplifier 81 includes a determination circuit 81b having input terminals supplied with the detection signal DET outputted by the detection circuit 81a1 and a detection signal PDET. The detection signal PDET is a signal that is obtained by performing logic synthesis on detection signals DET0 and DET1 outputted by the pre-sense amplifiers 82 and 83. An example of the circuit that generates the detection signal PDET will be described below.

The determination circuit 81b outputs a determination result (signal DATA) that is obtained by determining the logical value of the data stored in the memory cell 11 based on the difference between a time at which the detection signal DET changes and a time at which the detection signal PDET changes. For example, when the detection signal DET changes earlier than the detection signal PDET, the determination circuit 81b outputs the signal DATA that indicates data of logical value "1". In contrast, when the detection signal PDET changes earlier than the detection signal DET, the determination circuit 81b outputs the signal DATA that indicates data of logical value "0".

The other bit lines connected to a plurality of memory cells are also connected to pre-sense amplifiers having the same configuration as that of the pre-sense amplifier 81.

A detection circuit 82a1 in a reset circuit 82a in the pre-sense amplifier 82 connected to the reference cell 12 via the bit line BLR1 is an inverter, for example.

When the amplified signal Pout1 rises and reaches a predetermined magnitude (an inverted threshold of the inverter), the logic level of the detection signal DET1 outputted by the detection circuit 82a1 changes from an H level to an L level. In addition, the reset circuit 82a includes an inverter 82a2 that outputs a signal STOP1 that is obtained by inverting the logic level of the detection signal DET1 outputted by the detection circuit 82a1. The signal STOP1 is a signal that is obtained by delaying the amplified signal Pout1.

In addition, the pre-sense amplifier 82 includes a determination circuit 82b having input terminals that are supplied with the detection signal DET1 outputted by the detection circuit 82a1 and the detection signal PDET.

The determination circuit 82b outputs a determination result (signal DATAR1) that is obtained by determining the logical value of the data stored in the reference cell 12 based on the difference between a time at which the detection signal DET1 changes and a time at which the detection signal PDET changes.

The pre-sense amplifier 83 connected to the reference cell 13 via the bit line BLR0 has the same circuit configuration as that of the pre-sense amplifier 82. The pre-sense amplifier 83 outputs a signal STOP0, the detection signal DET0, and a signal DATAR0 that correspond to the signal STOP1 and the detection signal DET1 outputted by the pre-sense amplifier 82 and the signal DATA.

The determination circuits 81b and 82b may be arranged outside the pre-sense amplifiers 81 and 82.

Figure 13:
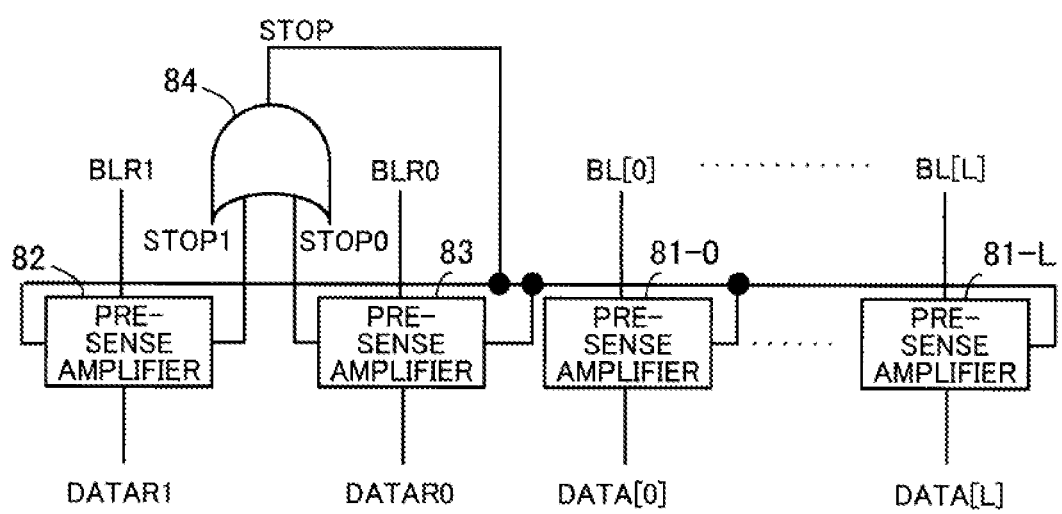
FIG. 13 illustrates an example of a circuit that generates a signal STOP.

FIG. 13 illustrates an example of a circuit that generates a signal STOP.

For example, the circuit that generates the signal STOP is an OR circuit 84 as illustrated in FIG. 13. The OR circuit 84 outputs a result of an OR operation on the signals STOP1 and STOP0 outputted by the pre-sense amplifiers 82 and 83 as the signal STOP. When at least one of the logic levels of the signals STOP1 and STOP0 rises, the logic level of the signal STOP also rises. The signal STOP is supplied not only to the pre-sense amplifiers 81-0 to 81-L but also to the pre-sense amplifiers 82 and 83. The pre-sense amplifiers 81-0 to 81-L are the pre-sense amplifiers that read the data of the memory cells (not illustrated) connected to the bit line BL[0] to BL[L] and output signal DATA[0] to DATA[L]. The pre-sense amplifiers 81-0 to 81-L have the same circuit configuration as that of the pre-sense amplifier 81 illustrated in FIG. 12.

Figure 14:
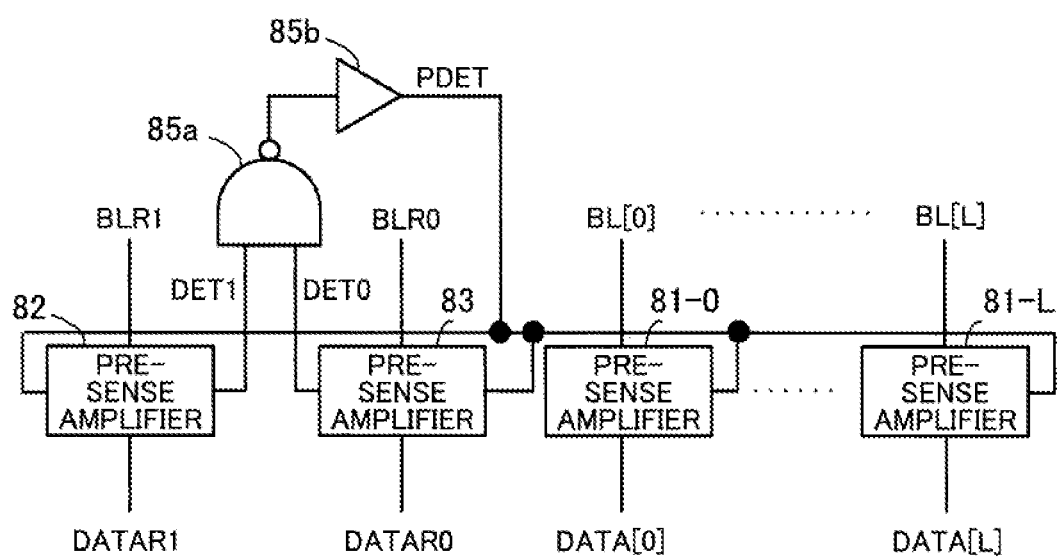
FIG. 14 illustrates an example of a circuit that generates a detection signal PDET.

FIG. 14 illustrates an example of a circuit that generates the detection signal PDET.

As illustrated in FIG. 14, this circuit that generates the detection signal PDET may be configured by, for example, a NAND circuit 85a and a delay circuit 85b. The NAND circuit 85a outputs a result of a NAND operation on the detection signals DET1 and DET0 outputted by the pre-sense amplifiers 82 and 83, and the delay circuit 85b delays the output signal of the NAND circuit 85a and outputs the resultant signal as the detection signal PDET. The detection signal PDET is supplied not only to the pre-sense amplifiers 81-0 to 81-L but also to the pre-sense amplifiers 82 and 83. The delay time of the delay circuit 85b is adjusted in such a manner that a time at which the detection signal PDET changes falls between a time at which the detection signal DET changes when data of logical value "1" is written in the memory cell 11 and a time at which the detection signal DET changes when data of logical value "0" is written in the memory cell 11.

As illustrated in FIGS. 13 and 14, the signal STOP and the detection signal PDET are generated based on both of the outputs of the pre-sense amplifiers 82 and 83. In this way, the functions of the pre-sense amplifiers 82 and 83 are exchangeable. Namely, the pre-sense amplifier 82 may be configured to process data of logical value "0", and the pre-sense amplifier 83 may be configured to process data of logical value "1". Thus, data of logical value "0" may be stored in the reference cell 12, and data of logical value "1" may be stored in the reference cell 13.

In addition, as illustrated in FIGS. 12 to 14, the signal DATA (DATA[0] to DATA[L]), DATAR1, and DATAR0 outputted by the pre-sense amplifiers 81 (81-0 to 81-L), 82, and 83 may be used as read data. Thus, use of another determination circuit is not needed.

Figure 15:
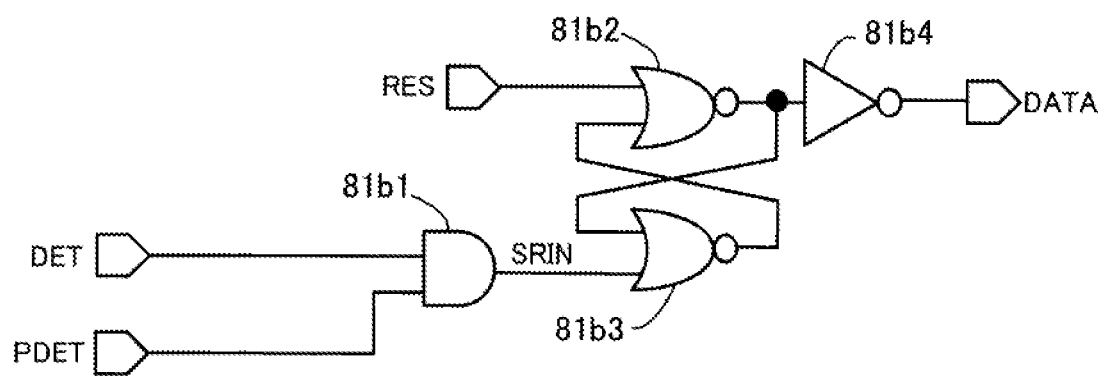
FIG. 15 illustrates an example of a determination circuit.

FIG. 15 illustrates an example of the determination circuit 81b.

While FIG. 15 illustrates an example of the determination circuit 81b, the determination circuit 82b also has the same circuit configuration as that of the determination circuit 81b.

The determination circuit 81b includes an AND circuit 81b1, NOR circuits 81b2 and 81b3, and an inverter 81b4.

The AND circuit 81b1 outputs a result of an AND operation on the detection signals DET and PDET as a signal SRIN.

The NOR circuits 81b2 and 81b3 are connected to each other to form an SR latch, and one of the input terminals of the NOR circuit 81b2 is supplied with a reset signal RES from the timing generation circuit 24, for example. One of the input terminals of the NOR circuit 81b3 is supplied with the signal SRIN. The output terminal of the NOR circuit 81b2, which is an output terminal of the SR latch, is connected to the input terminal of the inverter 81b4, and the output signal of the inverter 81b4 is the signal DATA.

Figure 16:
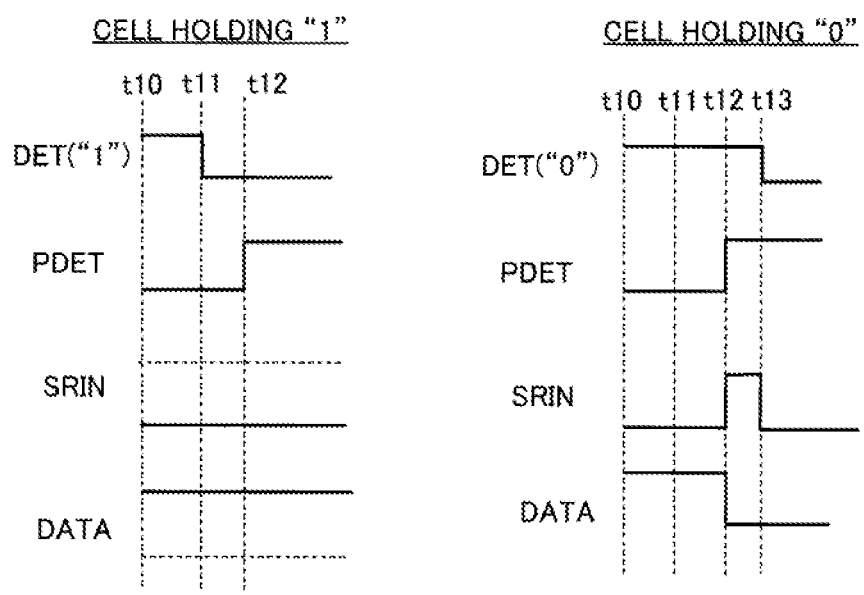
FIG. 16 is a timing chart illustrating an example of an operation of the determination circuit.

FIG. 16 is a timing chart illustrating an example of an operation of the determination circuit.

While not illustrated in FIG. 16, the logic level of the reset signal RES has already changed from an H level to an L level before timing t10. Thus, at timing t10, the logic level of the signal DATA is at an H level. In addition, at timing t10, the logic level of the detection signal DET is at an H level, and the logic level of the detection signal PDET is at an L level.

When data of logical value "1" is read from the memory cell 11 (when the memory cell 11 is a cell holding "1"), the amplified signal Pout rises and reaches a predetermined magnitude at timing t11. The logic level of the detection signal DET consequently drops from an H level to an L level. Next, at timing t12, the logic level of the detection signal PDET rises from an L level to an H level. At timing t11 and t12, since the logic level of the signal SRIN remains at an L level, the logic level of the signal DATA also remains at an H level.

In contrast, when data of logical value "0" is read from the memory cell 11 (when the memory cell 11 is a cell holding "0"), the logic level of the detection signal DET drops from an H level to an L level at timing t13, which is later than timing t12. Thus, at timing t12, the logic level of the signal SRIN rises from an L level to an H level, and the logic level of the signal DATA drops from an H level to an L level. While the logic level of the signal SRIN drops to an L level at timing t13, the state of the signal DATA is maintained by the SR latch.

In the case of the above semiconductor storage device 10 according to the first embodiment, the determination circuit 17 outputs a determination result that is obtained by determining the logical value of the data in the memory cell 11 based on the potential difference between the amplified signals Pout and Pout1 and the potential difference between the amplified signals Pout and Pout0. In this case, if the data in the memory cell 11 is not rewritten, the ferroelectric imprint progresses, and the data in the reference cells 12 and 13 is frequently rewritten, the amplified signal Pout could represent a voltage approximately at the midpoint of the amplified signals Pout0 and Pout1. As a result, an erroneous determination could be made.

In contrast, as described above, the semiconductor storage device 80 according to the fourth embodiment performs the data determination by using the difference between a time at which the detection signal DET changes when data of logical value "0" is read from the memory cell 11 and a time at which the detection signal DET changes when data of logical value "1" is read from the memory cell 11. Namely, since the magnitude of the voltage of the amplified signal Pout is not used for the data determination, the data determination is stably performed without being affected by fluctuation of the charge amount of the ferroelectric capacitor such as imprint.

In the case of the semiconductor storage device 80 according to the fourth embodiment, while the signal STOP does not contribute to the data determination, deterioration in the characteristics of the memory cell 11 is prevented by dropping the voltage of the bit line BL to the ground potential by using the signal STOP.

When this effect does not need to be considered, the semiconductor storage device 80 in FIG. 12 may be configured without the circuit configuration relating to the signal STOP. For example, the nMOS transistors 14c1 and 15c1, the inverter 82a2, etc. may be omitted.

In place of the pre-sense amplifiers 30a to 30d illustrated in FIG. 4, the pre-sense amplifiers 81 to 83 as described above may be used. In this case, the sense amplifiers 30e to 30h illustrated in FIG. 4 are not needed.

By modifying the circuit configurations of the pre-sense amplifiers 30b and 30d illustrated in FIGS. 5 and 6 as follows, the functions equivalent to those of the pre-sense amplifier 81 to 83 are achieved.

Figure 17:
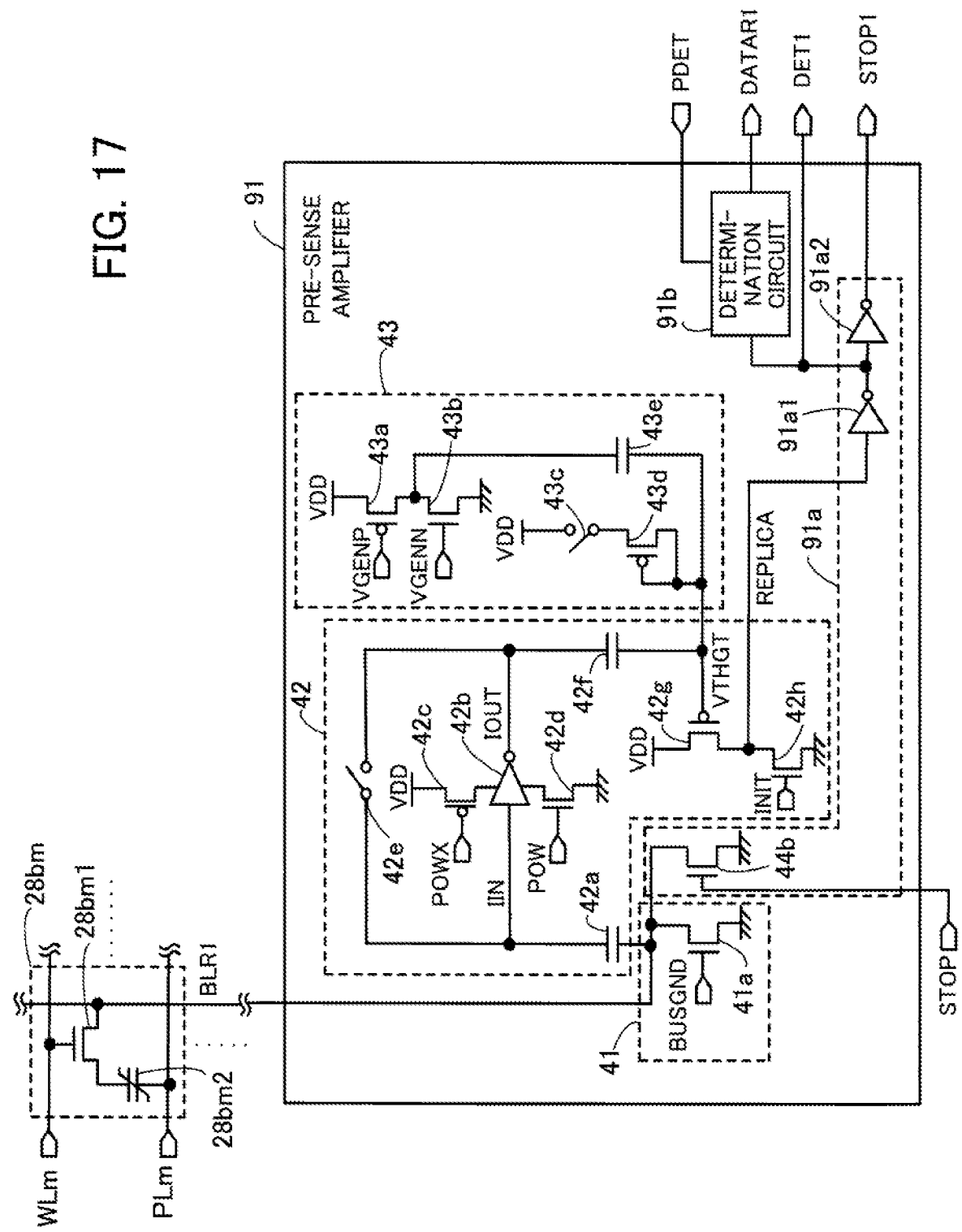
FIG. 17 illustrates an example of a pre-sense amplifier connected to memory cells which function as reference cells that hold data of logical value "1"

FIG. 17 illustrates an example of a pre-sense amplifier 91 connected to memory cells which function as reference cells that hold data of logical value "1". In FIGS. 5 and 17 illustrating the pre-sense amplifiers 30b and 91, like reference characters refer to like elements.

A detection circuit 91a1 in a reset circuit 91a in the pre-sense amplifier 91 is, for example, an inverter. When the voltage of the output signal REPLICA (corresponding to the amplified signal Pout1) of the amplifier circuit 42 rises and reaches a predetermined magnitude, the logic level of the detection signal DET1 outputted by the detection circuit 91a1 changes from an H level to an L level. The reset circuit 91a also includes an inverter 91a2 that outputs a signal STOP1 that is obtained by inverting the logic level of the detection signal DET1 outputted by the detection circuit 91a1.

In addition, the pre-sense amplifier 91 includes a determination circuit 91b having input terminals that are supplied with the detection signal DET1 outputted by the detection circuit 91a1 and the detection signal PDET.

The determination circuit 91b outputs a determination result (signal DATAR1) that is obtained by determining the logical value of the data stored in the memory cell 28bm based on the difference between a time at which the detection signal DET1 changes and a time at which the detection signal PDET changes. For example, the determination circuit 91b is formed by the same circuit configuration as that of the determination circuit 81b illustrated in FIG. 15.

The pre-sense amplifier connected to memory cells which function as reference cells that hold data of logical value "0" is also formed by the same circuit configuration as that of the pre-sense amplifier 91 illustrated in FIG. 17.

Figure 18:
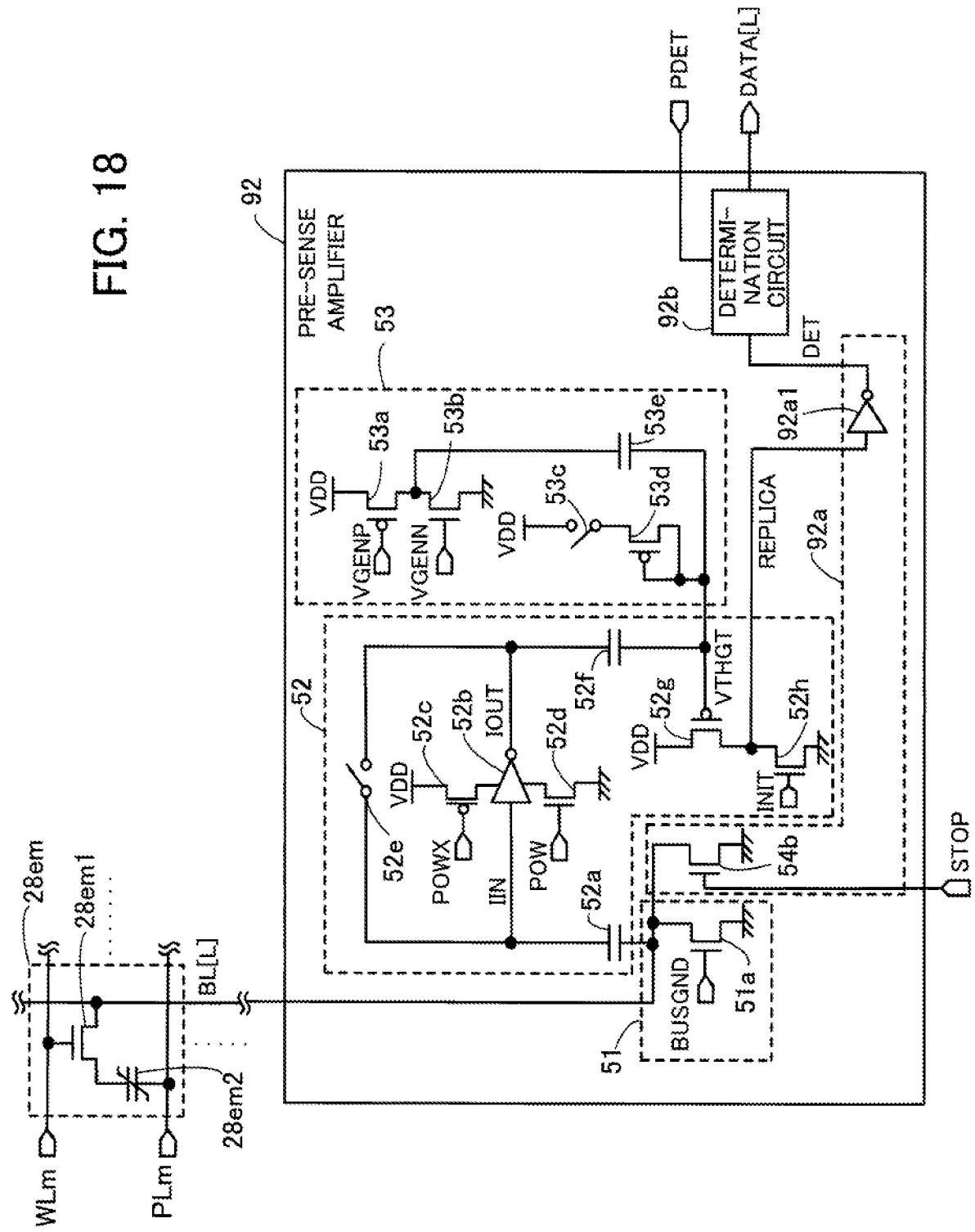
FIG. 18 illustrates an example of a pre-sense amplifier connected to memory cells that hold data of logical value "0" or "1"

FIG. 18 illustrates an example of a pre-sense amplifier 92 connected to memory cells that hold data of logical value "0" or "1". In the pre-sense amplifiers 30d and 92 illustrated in FIGS. 6 and 18, like reference characters refer to like elements.

A detection circuit 92a1 in a reset circuit 92a in the pre-sense amplifier 92 is, for example, an inverter. When the voltage of the output signal REPLICA (corresponding to the amplified signal Pout) of the amplifier circuit 52 rises and reaches a predetermined magnitude, the logic level of the detection signal DET outputted by the detection circuit 92a1 changes from an H level to an L level.

In addition, the pre-sense amplifier 92 includes a determination circuit 92b having input terminals supplied with the detection signal DET outputted by the detection circuit 92a1 and the detection signal PDET.

The determination circuit 92b outputs a determination result (signal DATA[L]) that is obtained by determining the logical value of the data stored in the memory cell 28em based on the difference between a time at which the detection signal DET changes and a time at which the detection signal PDET changes.

The signal STOP and the detection signal PDET are generated by the logic circuits illustrated in FIGS. 13 and 14, for example.

Figure 19:
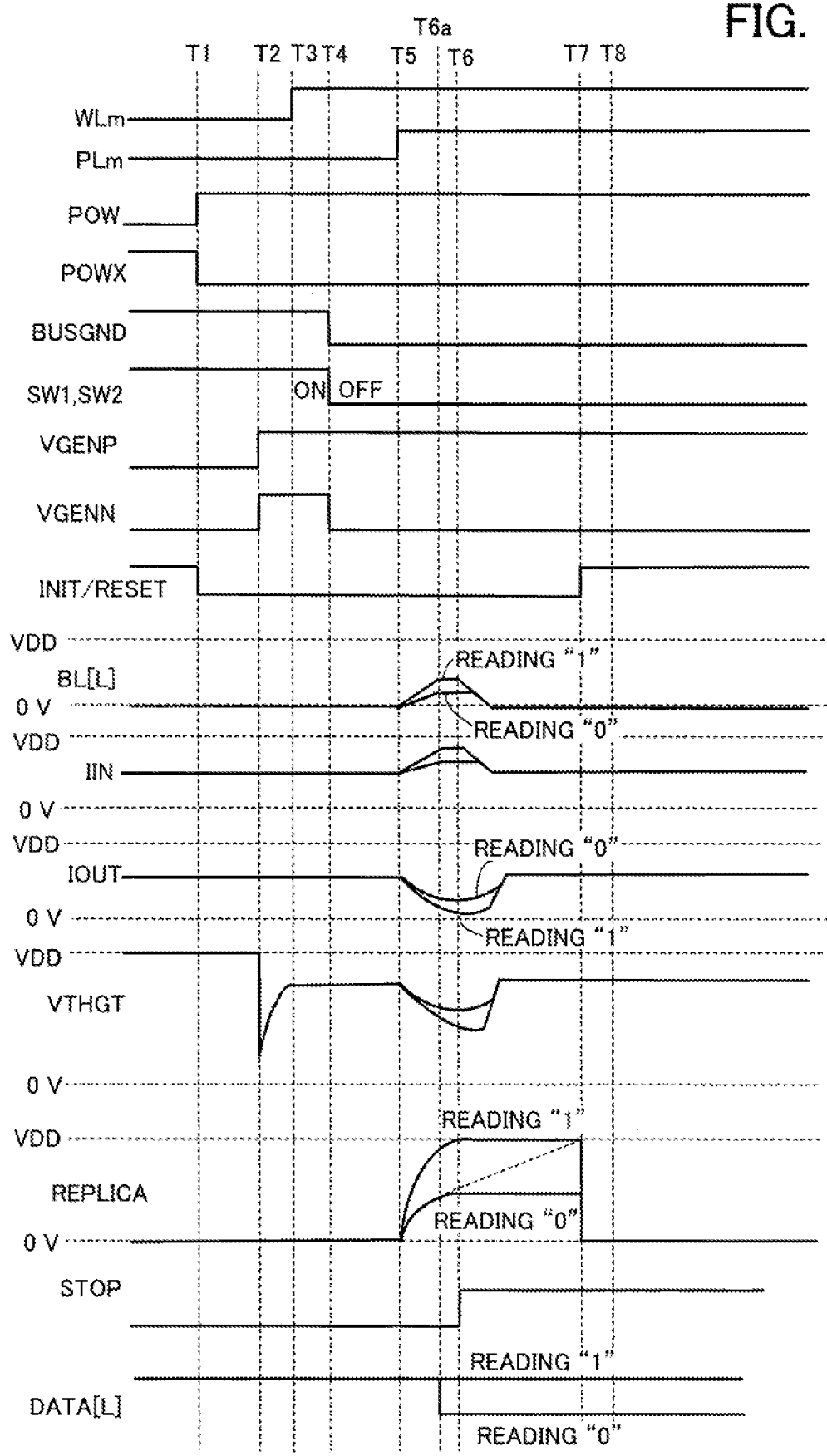
FIG. 19 is a timing chart illustrating an example of a read operation of the semiconductor storage device according to the fourth embodiment.

FIG. 19 is a timing chart illustrating an example of a read operation of the semiconductor storage device according to the fourth embodiment. FIG. 19 illustrates an operation example in which the pre-sense amplifiers 91 and 92 having the circuit configurations illustrated in FIGS. 17 and 18 are used. FIG. 19 illustrates the change of the signal DATA[L] over time, in addition to the changes of the signals illustrated in FIG. 7 over time. The changes of the signals other than the change of the signal DATA[L] over time are the same as those in FIG. 7 (the change of the signal STOP is simplified in FIG. 19).

The logic level of the signal DATA[L] has been set in advance at an H level by the reset signal supplied to the determination circuit 92b.

When data is read, the signal REPLICA of the pre-sense amplifier 91 rises (in the same way as the signal REPLICA changes over time when data of logical value "1" is read by the pre-sense amplifier 92 in FIG. 19). Next, while not illustrated in FIG. 19, when the signal REPLICA reaches a predetermined threshold, the logic level of the detection signal DET1 drops from an H level to an L level. After a predetermined delay time, the logic level of the detection signal PDET rises from an L level to an H level. Reading data of logical value "0" by the pre-sense amplifier 92 causes the voltage of the signal REPLICA to change more slowly than reading of data of logical value "1". Thus, in this case, the logic level of the detection signal DET remains at an H level. As a result, when the logic level of the detection signal PDET reaches an H level while the logic level of the detection signal DET remains at an H level, the determination circuit 92b sets the logic level of the signal DATA[L] to an L level.

In contrast, when data of logical value "1" is read by the pre-sense amplifier 92, the logic level of the detection signal DET changes to an L level earlier than a time at which the detection signal PDET changes. As a result, the logic level of the signal DATA[L] outputted by the determination circuit 92b remains at an H level.

In the example in FIG. 19, timing T6a at which the logic level of the signal DATA[L] is determined is earlier than timing T6 at which the logic level of the signal STOP rises from an L level to an H level.

Fifth Embodiment

Figure 20:
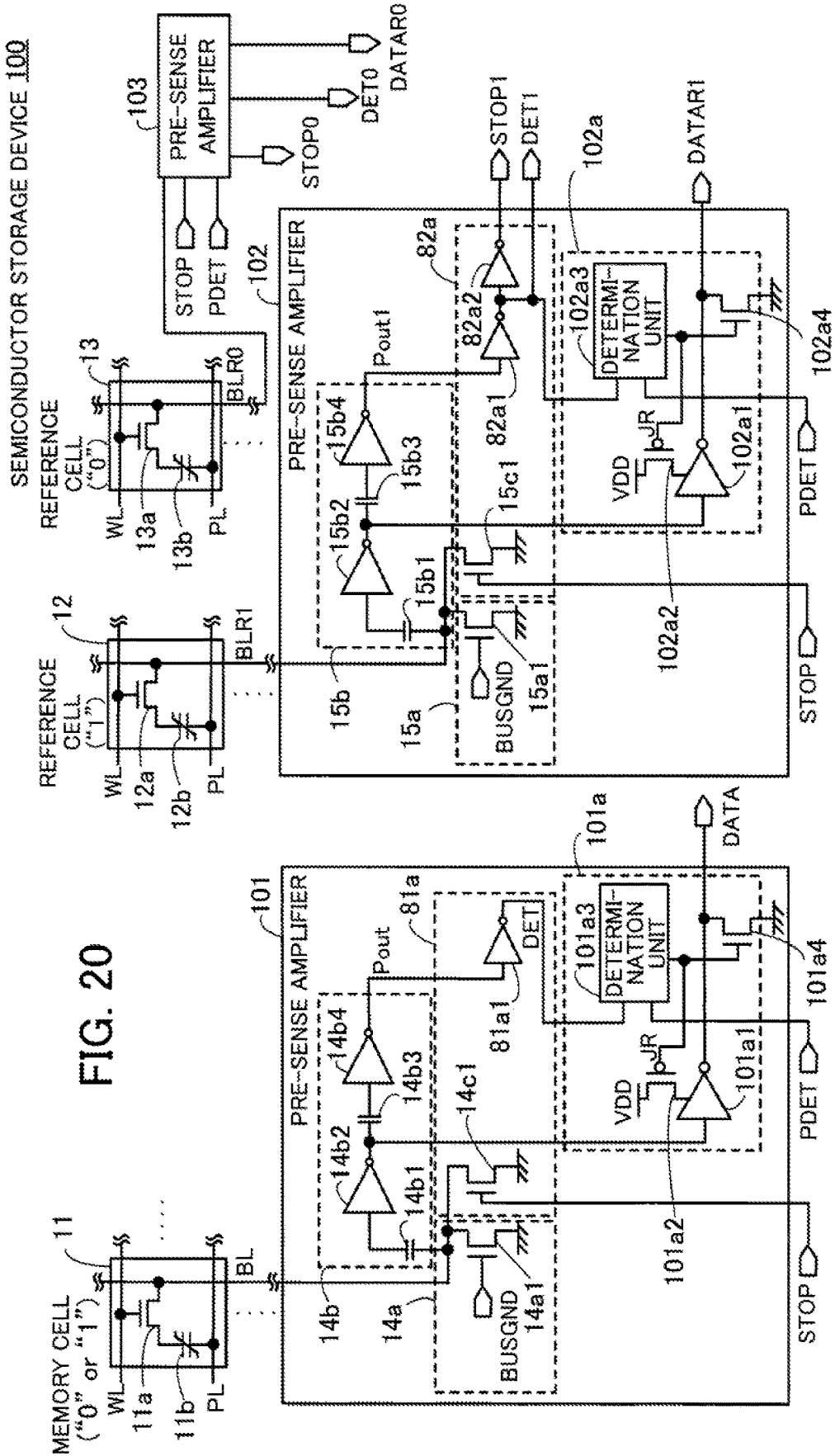
FIG. 20 illustrates an example of a semiconductor storage device according to a fifth embodiment.

FIG. 20 illustrates an example of a semiconductor storage device according to a fifth embodiment. In the semiconductor storage devices 80 and 100 according to the fourth and fifth embodiments illustrated in FIGS. 12 and 20, like reference characters refer to like elements.

A determination circuit 101a in a pre-sense amplifier 101 in the semiconductor storage device 100 according to the fifth embodiment includes an inverter 101a1, a pMOS transistor 101a2, a determination unit 101a3, and an nMOS transistor 101a4.

The input terminal of the inverter 101a1 is connected to the output terminal of the inverter 14b2, and the output signal of the inverter 101a1 is the signal DATA.

The gate of the pMOS transistor 101a2 is supplied with a signal JR outputted by the determination unit 101a3. When the logic level of the signal JR is at an L level, the pMOS transistor 101a2 is set to an on-state, supplies the power supply voltage VDD to the inverter 101a1, and activates the inverter 101a1.

The determination unit 101a3 outputs the signal JR that indicates the difference between a time at which the detection signal DET changes and a time at which the detection signal PDET changes. When the detection signal DET changes earlier than the detection signal PDET, the determination unit 101a3 outputs an L-level signal JR. In contrast, when the detection signal DET changes later than the detection signal PDET, the determination unit 101a3 outputs an H-level signal JR. The signal JR is supplied to the gates of the pMOS transistor 101a2 and the nMOS transistor 101a4 and functions as a control signal that controls on and off of the pMOS transistor 101a2 and the nMOS transistor 101a4. For example, the determination unit 101a3 has the same circuit configuration as that of the determination circuit 81b illustrated in FIG. 15 without the inverter 81b4.

The gate of the nMOS transistor 101a4 is supplied with the signal JR, which controls on and off of the nMOS transistor 101a4. The source voltage of the nMOS transistor 101a4 is at the ground potential, and the drain voltage of the nMOS transistor 101a4 indicates a determination result (signal DATA) of the read data.

With this determination circuit 101a, when data reading is started, the logic level of the signal JR is set to an L level by the reset signal (not illustrated) supplied to the determination unit 101a3, the pMOS transistor 101a2 is set to an on-state, and the inverter 101a1 is activated. In addition, the nMOS transistor 101a4 is set to an off-state.

When data reading is started, since the logic level of the output signal of the inverter 14b2 changes to an L level, the inverter 101a1 sets the logic level of the signal DATA, which is the drain voltage of the nMOS transistor 101a4, to an H level.

In this way, the circuit unit including the inverter 101a1 and the pMOS transistor 101a2 previously rises the above drain voltage before the determination unit 101a3 outputs the signal JR that reflects the difference between a time at which the detection signal DET changes and a time at which the detection signal PDET changes.

When the detection signal DET changes earlier than the detection signal PDET, since the determination unit 101a3 continuously outputs the L-level signal JR, the logic level of the signal DATA remains at an H level. In contrast, when the detection signal DET changes later than the detection signal PDET, since the determination unit 101a3 outputs an H-level signal JR, the pMOS transistor 101a2 is set to an off-state. Thus, the inverter 101a1 is not activated. In addition, since the nMOS transistor 101a4 is set to an on-state, the logic level of the signal DATA drops to an L level.

Since use of this determination circuit 101a achieves removal of the inverter 81b4 from the determination circuit 81b illustrated in FIG. 15, a data determination result is obtained more quickly.

Other bit lines connected to a plurality of memory cells are also connected to pre-sense amplifiers having the same configuration as that of the pre-sense amplifier 101.

A determination circuit 102a in a pre-sense amplifier 102 includes an inverter 102a1, a pMOS transistor 102a2, a determination unit 102a3, and an nMOS transistor 102a4 and has the same circuit configuration as that of the determination circuit 101a in the pre-sense amplifier 101.

A pre-sense amplifier 103 connected to the reference cell 13 via the bit line BLR0 has the same circuit configuration as that of the pre-sense amplifier 102.

The determination circuits 101a and 102a may be arranged outside the pre-sense amplifiers 101 and 102.

The above determination circuits 101a and 102a may be used in place of the determination circuits 91b and 92b in the pre-sense amplifiers 91 and 92 in FIGS. 17 and 18. In this case, the output voltage IOUT is applied to the input terminals of the inverters 101a1 and 102a1.

Figure 21:
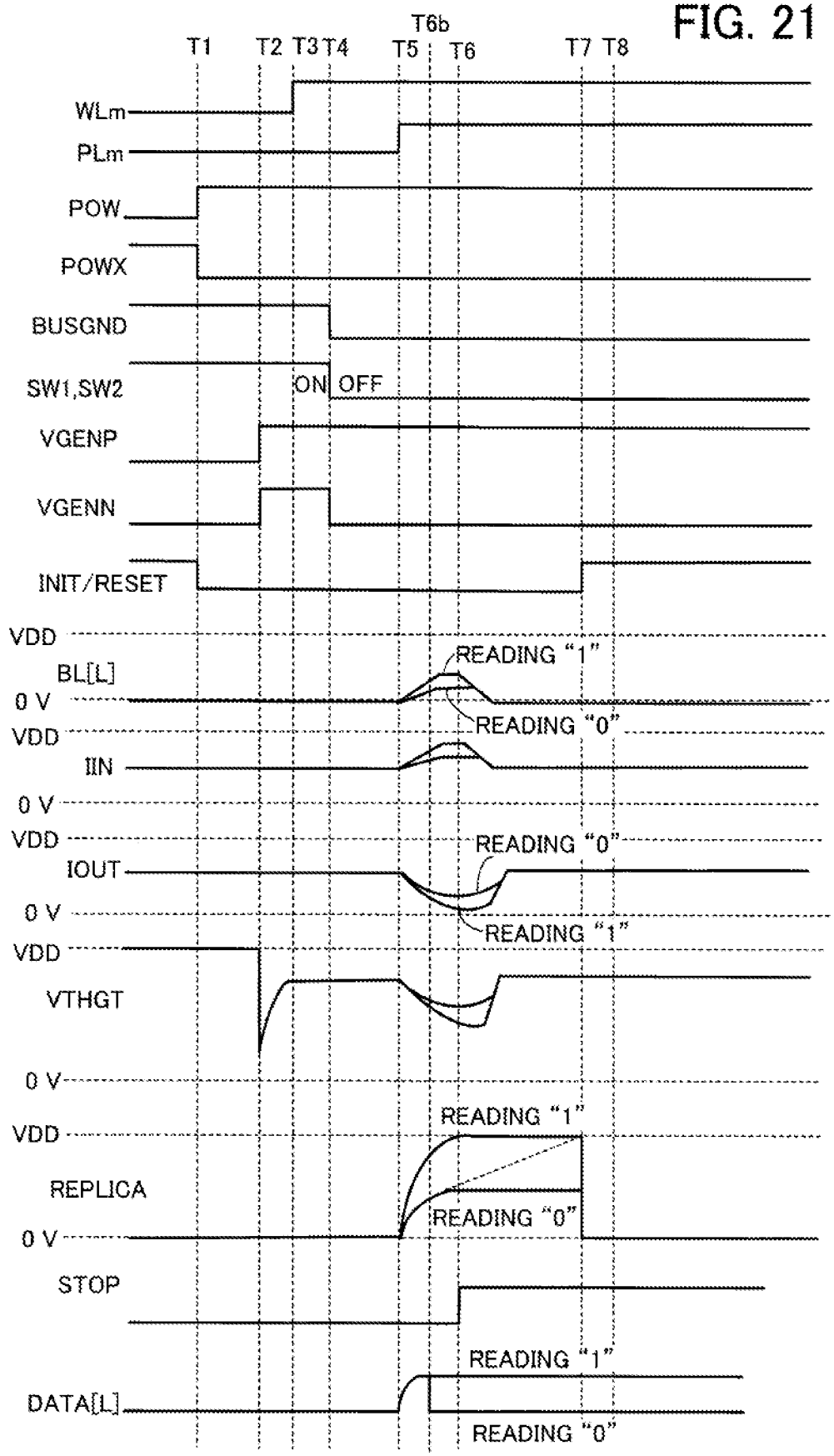
FIG. 21 is a timing chart illustrating an example of a read operation of the semiconductor storage device according to the fifth embodiment.

FIG. 21 is a timing chart illustrating an example of a read operation of the semiconductor storage device according to the fifth embodiment. FIG. 21 illustrates an operation example in which the above determination circuits 101a and 102a are used in place of the determination circuits 91b and 92b in the pre-sense amplifiers 91 and 92 illustrated in FIGS. 17 and 18. FIG. 21 illustrates the change of the signal DATA[L] over time, in addition to the changes of the signals over time illustrated in FIG. 7. The changes of the signals other than the change of the signal DATA[L] over time are the same as those in FIG. 7 (the change of the signal STOP is simplified in FIG. 21).

The logic level of the signal DATA[L] remains at an L level until the output voltage IOUT begins to drop from VDD/2. When the output voltage IOUT begins to drop from VDD/2 (timing T5), the voltage of the signal DATA[L] begins to rise.

When the detection signal DET changes later than the detection signal PDET (when data of logical value "0" is read), the determination unit 101a3 outputs an H-level signal JR. As a result, since the nMOS transistor 101a4 is set to an on-state, the logic level of the signal DATA[L] changes to an L level (timing T6b). When the detection signal DET changes earlier than the detection signal PDET (when data of logical value "1" is read), the determination unit 101a3 outputs an L-level signal JR. In this case, since the nMOS transistor 101a4 remains in an off-state, the logical level of the signal DATA[L] remains at an H level.

When data of logical value "0" is read, timing T6a at which the logic level of the signal DATA[L] is determined is even earlier than timing T6a illustrated in FIG. 19.

Sixth Embodiment

Figure 22:
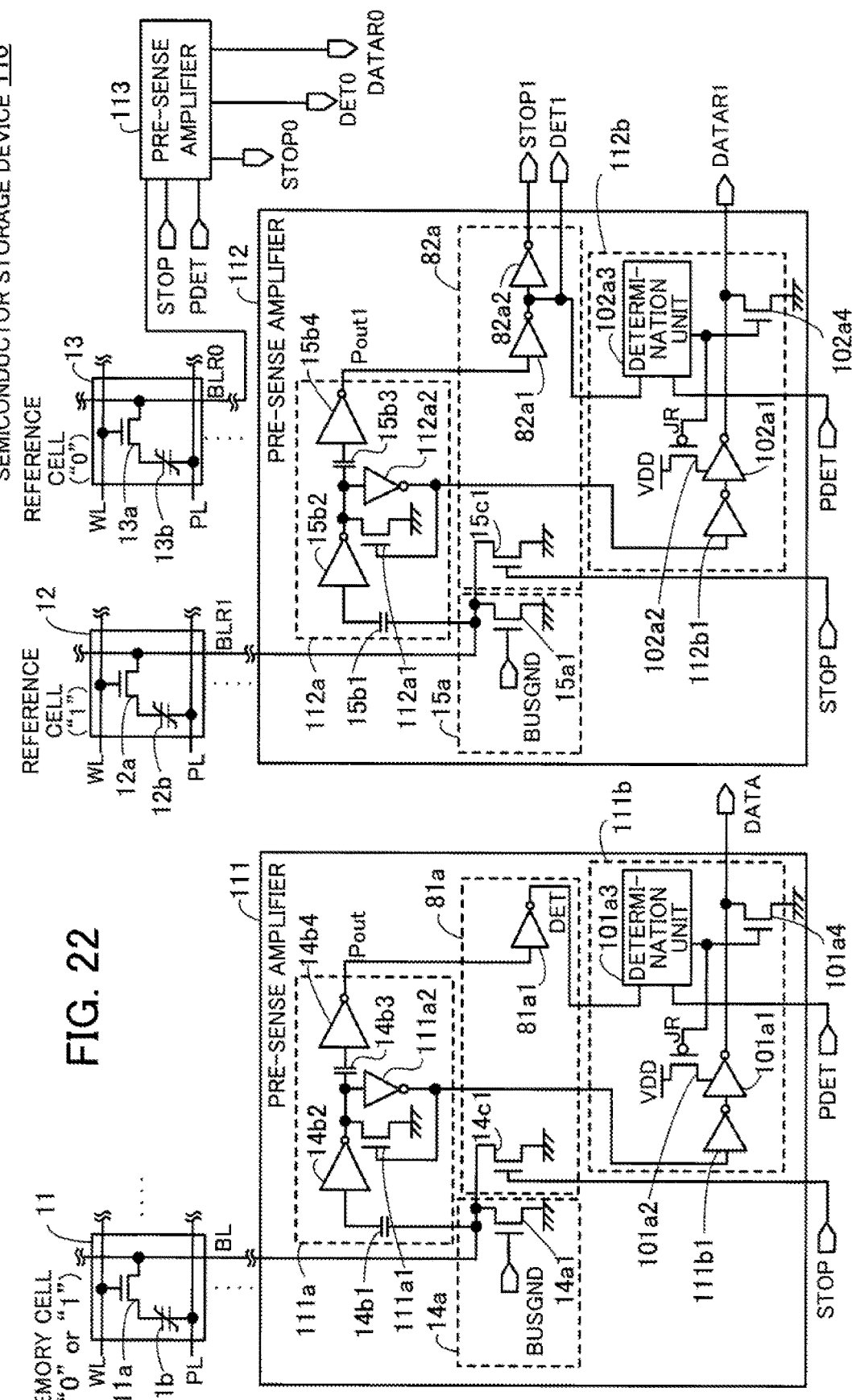
FIG. 22 illustrates an example of a semiconductor storage device according to a sixth embodiment.

FIG. 22 illustrates an example of a semiconductor storage device according to a sixth embodiment. In the semiconductor storage devices 100 and 110 according to the fifth and sixth embodiments illustrated in FIGS. 20 and 22, like reference characters refer to like elements.

An amplifier circuit 111a in a pre-sense amplifier 111 in the semiconductor storage device 110 according to the sixth embodiment includes an nMOS transistor 111a1 and an inverter 111a2.

The drain of the nMOS transistor 111a1 and the input terminal of the inverter 111a2 are connected to the output terminal of the inverter 14b2, and the source of the nMOS transistor 111a1 is connected to ground. The gate of the nMOS transistor 11a1 and the output terminal of the inverter 111a2 are connected to a determination circuit 111b.

By arranging these nMOS transistor 111a1 and inverter 111a2, as is the case with the pre-sense amplifiers 60 and 70 in the semiconductor storage device according to the third embodiment, the output voltage of the inverter 14b2 drops more quickly. As a result, the amplified signal Pout rises more quickly.

The nMOS transistor 111a1 and the inverter 111a2 may be arranged outside the amplifier circuit 111a.

The determination circuit 111b includes an inverter 111b1. The input terminal of the inverter 111b1 is connected to the gate of the nMOS transistor 111a1 and the output terminal of the inverter 111a2. The output terminal of the inverter 111b1 is connected to the input terminal of the inverter 101a1.

Other bit lines connected to a plurality of memory cells are also connected to pre-sense amplifiers having the same configuration as that of the pre-sense amplifier 111.

An amplifier circuit 112a in a pre-sense amplifier 112 includes an nMOS transistor 112a1 and an inverter 112a2 and has the same circuit configuration as that of the amplifier circuit 111a in the pre-sense amplifier 111. In addition, a determination circuit 112b in the pre-sense amplifier 112 includes an inverter 112b1 and has the same circuit configuration as that of the determination circuit 111b in the pre-sense amplifier 111.

A pre-sense amplifier 113 connected to the reference cell 13 via the bit line BLR0 has the same circuit configuration as that of the pre-sense amplifier 112.

The determination circuits 111b and 112b may be arranged outside the pre-sense amplifiers 111 and 112.

The above determination circuits 111b and 112b may be used in place of the determination circuits 91b and 92b in the pre-sense amplifiers 91 and 92 illustrated in FIGS. 17 and 18. In this case, the output terminal of the inverter 52b in the pre-sense amplifier 92 is connected to the drain of the nMOS transistor 111a1 and the input terminal of the inverter 111a2. In addition, the output terminal of the inverter 42b in the pre-sense amplifier 91 is connected to the drain of the nMOS transistor 112a1 and the input terminal of the inverter 112a2.

Figure 23:
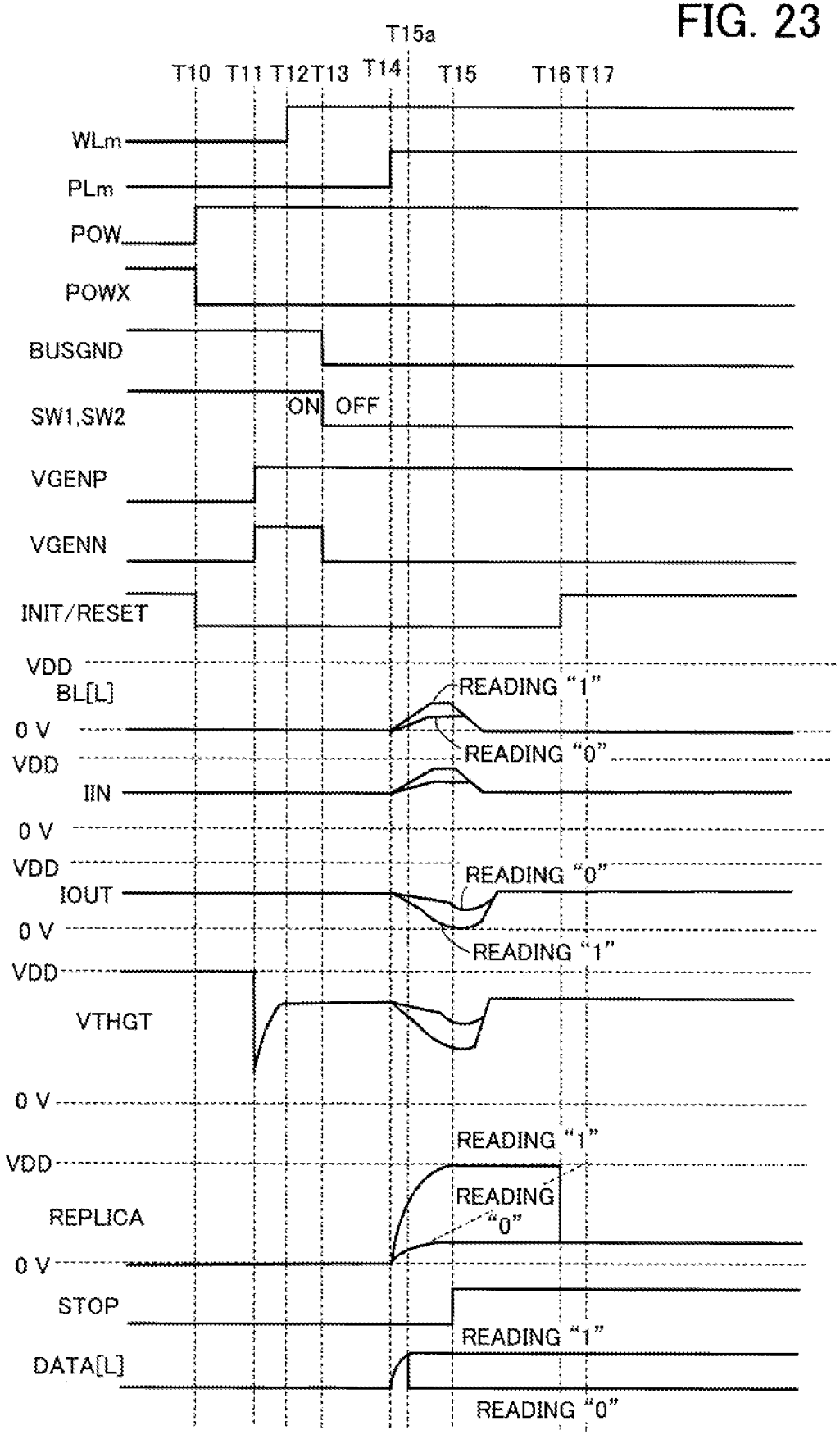
FIG. 23 is a timing chart illustrating an example of a read operation of the semiconductor storage device according to the sixth embodiment.

FIG. 23 is a timing chart illustrating an example of a read operation of the semiconductor storage device according to the sixth embodiment. In the operation example illustrated in FIG. 23, the determination circuits 111b and 112b are used in place of the determination circuits 91b and 92b in the pre-sense amplifiers 91 and 92 illustrated in FIGS. 17 and 18. In addition, the nMOS transistors 111a1 and 112a1 and the inverters 111a2 and 112a2 as described above are used. FIG. 23 illustrates the change of the signal DATA[L] over time, in addition to the changes of the signals illustrated in FIG. 10 over time. The changes of the signals other than the change of the signal DATA[L] over time are the same as those in FIG. 10 (the change of the signal STOP is simplified in FIG. 23).

The logic level of the signal DATA[L] remains at an L level until the output voltage IOUT begins to drop from VDD/2. When the output voltage IOUT begins to drop from VDD/2 (timing T14), the voltage of the signal DATA[L] begins to rise. At this point, since the nMOS transistor 111a1 and the inverter 111a2 are arranged, as is the case with the pre-sense amplifiers 60 and 70 in the semiconductor storage device according to the third embodiment, the output voltage IOUT drops more quickly. As a result, the output signal REPLICA rises more quickly.

Thus, when data of logical value "0" is read, the timing at which the determination unit 101a3 outputs an H-level signal JR (timing T15a at which the signal DATA[L] changes) is earlier than that of the semiconductor storage device 100 according to the fifth embodiment.

Seventh Embodiment

Figure 24:
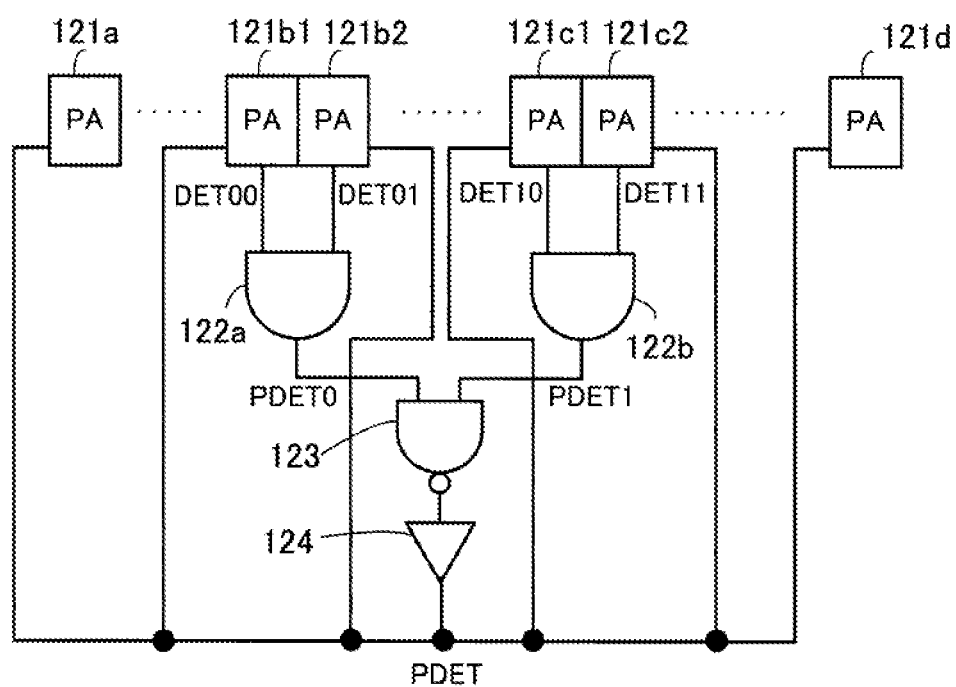
FIG. 24 illustrates an example of a semiconductor storage device according to a seventh embodiment.

FIG. 24 illustrates an example of a semiconductor storage device 120 according to a seventh embodiment.

While FIG. 24 illustrates only the pre-sense amplifiers and the circuit unit that generates a detection signal PDET, the other elements are the same as those of the semiconductor storage devices 80, 100, and 110 according to the fourth to sixth embodiments.

The semiconductor storage device 120 according to the seventh embodiment includes a plurality of pre-sense amplifiers (pre-sense amplifiers 121a, 121b1, 121b2, 121c1, 121c2, 121d, etc.), AND circuits 122a and 122b, a NAND circuit 123, and a delay circuit 124.

Among the plurality of pre-sense amplifiers, the pre-sense amplifiers 121b1 and 121b2 are pre-sense amplifiers connected to reference cells that hold data of logical value "0". The pre-sense amplifiers 121c1 and 121c2 are pre-sense amplifiers connected to reference cells that hold data of logical value "1".

The pre-sense amplifiers 121b1, 121b2, 121c1, and 121c2 have the same circuit configuration as that of any one of the pre-sense amplifiers 82, 91, 102, and 112 illustrated in FIGS. 12, 17, 20, and 22. The other pre-sense amplifiers have the same circuit configuration as that of any one of the pre-sense amplifiers 81, 92, 101, and 111 illustrated in FIGS. 12, 18, 20, and 22.

Detection signals DET00 and DET01 outputted by the pre-sense amplifiers 121b1 and 121b2 correspond to the above detection signal DET0, and detection signals DET10 and DET11 outputted by the pre-sense amplifiers 121c1 and 121c2 correspond to the above detection signal DET1.

The AND circuit 122a outputs a detection signal PDET0, which is a result of an AND operation on the detection signals DET00 and DET01, and the AND circuit 122b outputs a detection signal PDET1, which is a result of an AND operation on the detection signals DET10 and DET11. The NAND circuit 123 outputs the detection signal PDET, which is a result of a NAND operation on the detection signals PDET0 and PDET1. The delay circuit 124 delays the output signal of the NAND circuit 123 and outputs the resultant signal as the detection signal PDET. The detection signal PDET is supplied to each of the plurality of pre-sense amplifiers.

With this configuration, even when a failure occurs in a reference cell connected to one of the pre-sense amplifiers 121b1 and 121b2 or one of the pre-sense amplifiers 121c1 and 121c2, the detection signal PDET is properly generated.

Figure 25:
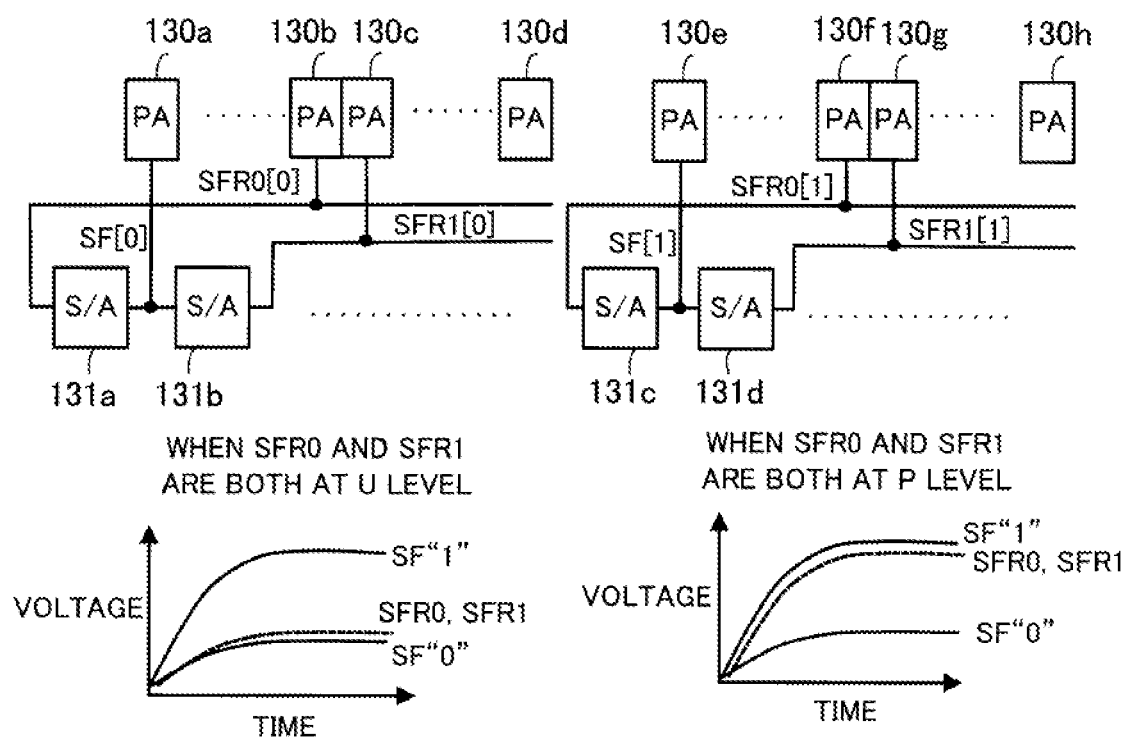
FIG. 25 illustrates a semiconductor storage device according to a comparative example.

FIG. 25 illustrates a semiconductor storage device according to a comparative example.

The semiconductor storage device according to the comparative example includes a plurality of pre-sense amplifiers (pre-sense amplifiers 130a, 130b, 130c, 130d, 130e, 130f, 130g, 130h, etc.) and a plurality of sense amplifiers (sense amplifiers 131a, 131b, 131c, 131d, etc.).

Among the plurality of pre-sense amplifiers, the pre-sense amplifiers 130b and 130f are pre-sense amplifiers connected to reference cells that hold data of logical value "0". In addition, the pre-sense amplifiers 130c and 130g are pre-sense amplifiers connected to reference cells that hold data of logical value "1".

The pre-sense amplifiers 130b and 130f output signals SFR0[0] and SFR0[1] that correspond to the above amplified signal Pout0, and the pre-sense amplifiers 130c and 130g output signals SFR1[0] and SFR1[1] that correspond to the above amplified signal Pout1.

The sense amplifiers 131a and 131b function as twin sense amplifiers and perform data determination based on the signal SF[0] (corresponding to the above amplified signal Pout) outputted by the pre-sense amplifier 130a and the signals SFR0[0] and SFR1[0]. The sense amplifiers 131c and 131d also function as twin sense amplifiers and perform data determination based on the signal SF[1] (corresponding to the above amplified signal Pout) outputted by the pre-sense amplifier 130e and the signals SFR0[1] and SFR1[1].

FIG. 25 illustrates examples of how the voltages of the signal SF (the signal SF[0] or signal SF[1], for example), the signal SFR0 (the signal SFR0[0] or the signal SFR0[1]), and the signal SFR1 (the signal SFR1[0] or the signal SFR1[1]) change over time.

When both of the signals SFR0 and SFR1 are at a U level (a signal level that corresponds to data of logical value "0") or at a P level (a signal level that corresponds to data of logical value "1"), the margin with respect to the signal SF could be reduced, and the data could not be determined properly.

In the case of the above comparative example, even if two reference cells that hold data of logical value "0" and two reference cells that hold data of logical value "1" are arranged, since the data determination is performed based on the potential difference, it is difficult to establish a configuration that properly respond to cell failure (redundant configuration).

In contrast, as is the case with the semiconductor storage devices 80, 100, and 110, the semiconductor storage device 120 performs data determination by using the difference between times at which the detection signals DET change when data of logical value "0" or "1" is read from the memory cells. Thus, as illustrated in FIG. 24, a redundant configuration is easily configured.

While an aspect of a semiconductor storage device and a read method thereof has been described based on an individual one of the above embodiments, the above description is exemplary, and the embodiments are not limited to the above description.

In one aspect, the embodiments prevent reduction of the read margin that could occur when data written in a memory cell is read.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor storage device comprising:
   a memory cell which includes a first capacitor that accumulates charges of a first charge amount corresponding to data of a first logical value or data of a second logical value, reading of which causes a voltage of a bit line to change more quickly than reading of the data of the first logical value;
   a first reference cell which includes a second capacitor that accumulates charges of a second charge amount corresponding to data of the second logical value and which is read with the memory cell when the memory cell is read;
   a second reference cell which includes a third capacitor that accumulates charges of a third charge amount corresponding to data of the first logical value and which is read with the memory cell when the memory cell is read;
   a first read circuit which is connected to the first reference cell via a first bit line, generates a first amplified signal by amplifying a first voltage of the first bit line when the memory cell is read, and outputs a stop signal that is obtained by delaying the first amplified signal;
   a second read circuit which is connected to the second reference cell via a second bit line, generates a second amplified signal by amplifying a second voltage of the second bit line when the memory cell is read, receives the stop signal, and drops the second voltage to a ground potential when a voltage of the stop signal reaches a threshold;
   a third read circuit which is connected to the memory cell via a third bit line, generates a third amplified signal by amplifying a third voltage of the third bit line when the memory cell is read, receives the stop signal, and drops the third voltage to the ground potential when the voltage of the stop signal reaches the threshold; and
   a determination circuit which outputs a determination result that is obtained by determining a logical value of data stored in the memory cell based on a potential difference between the first amplified signal and the third amplified signal and a potential difference between the second amplified signal and the third amplified signal.

2. The semiconductor storage device according to claim 1, wherein a delay time of the stop signal with respect to the first amplified signal is set in such a manner that the voltage of the stop signal reaches the threshold when the third amplified signal generated when data of the second logical value is read is saturated.

3. The semiconductor storage device according to claim 1, wherein the third read circuit includes a first n-channel type metal-oxide-semiconductor field-effect transistor (MOSFET) having a drain that is connected to the third bit line, a gate that is supplied with the stop signal, and a source that is connected to ground, and
   wherein the threshold is a threshold voltage of the first n-channel type MOSFET.

4. The semiconductor storage device according to claim 1, wherein each of the first read circuit, the second read circuit, and the third read circuit includes an amplifier circuit that generates a corresponding one of the first amplified signal, the second amplified signal, and the third amplified signal,
   wherein the amplifier circuit includes:
   a fourth capacitor having one end connected to a corresponding one of the first bit line, the second bit line, and the third bit line;
   a first inverter having a first input terminal connected to another end of the fourth capacitor;
   a fifth capacitor having one end connected to a first output terminal of the first inverter; and
   a second inverter that has a second input terminal connected to another end of the fifth capacitor and that outputs a corresponding one of the first amplified signal, the second amplified signal, and the third amplified signal.

5. The semiconductor storage device according to claim 4,
wherein the first input terminal and the first output terminal of the first inverter are connected to each other via a switch, and
wherein the switch changes from on to off between when the memory cell is selected and when a predetermined voltage is applied to a plate line connected to the first capacitor.

6. The semiconductor storage device according to claim 4, wherein the amplifier circuit further includes:
a second n-channel type MOSFET having a drain connected to the first output terminal of the first inverter and a source connected to ground; and
a third inverter having a third input terminal connected to the drain of the second n-channel type MOSFET and a third output terminal connected to a gate of the second n-channel type MOSFET.

7. The semiconductor storage device according to claim 4, further comprising:
a threshold voltage generation circuit that sets, before reading of the memory cell is started, a gate voltage of a p-channel type MOSFET included in the second inverter to a threshold voltage of the p-channel type MOSFET.

8. The semiconductor storage device according to claim 1, further comprising:
a plate line driver that applies a predetermined voltage to a plate line connected to the memory cell,
wherein, in a read period of the memory cell, the plate line driver writes back data of the first logical value to the memory cell by continuously applying the predetermined voltage to the plate line when the third voltage is dropped to the ground potential by the stop signal.

9. The semiconductor storage device according to claim 8, further comprising:
a write circuit that writes back, after the data of the first logical value is written back, data of the second logical value to the memory cell from which the data of the second logical value has been read, based on the determination result outputted by the determination circuit.

10. The semiconductor storage device according to claim 1, wherein each of the first read circuit, the second read circuit, and the third read circuit has a waveform shaping circuit that shapes a waveform of a corresponding one of the first amplified signal, the second amplified signal, and the third amplified signal.

11. The semiconductor storage device according to claim 1, wherein the first capacitor, the second capacitor, and the third capacitor are ferroelectric capacitors.

12. A semiconductor storage device comprising:
a memory cell which includes a first capacitor that accumulates charges of a first charge amount corresponding to data of a first logical value or data of a second logical value, reading of which causes a voltage of a bit line to change more quickly than reading of the data of the first logical value;
a first reference cell which includes a second capacitor that accumulates charges of a second charge amount corresponding to data of the second logical value and which is read with the memory cell when the memory cell is read;
a second reference cell which includes a third capacitor that accumulates charges of a third charge amount corresponding to data of the first logical value and which is read with the memory cell when the memory cell is read;
a first read circuit which is connected to one of the first reference cell and the second reference cell via a first bit line, generates a first amplified signal by amplifying a first voltage of the first bit line when the memory cell is read, outputs a first stop signal that is obtained by delaying the first amplified signal, receives a third stop signal based on the first stop signal and a second stop signal, and drops the first voltage to a ground potential when the voltage of the third stop signal reaches a threshold;
a second read circuit which is connected to another one of the first reference cell and the second reference cell via a second bit line, generates a second amplified signal by amplifying a second voltage of the second bit line when the memory cell is read, outputs the second stop signal that is obtained by delaying the second amplified signal, receives the third stop signal, and drops the second voltage to the ground potential when the voltage of the third stop signal reaches the threshold;
a third read circuit which is connected to the memory cell via a third bit line, generates a third amplified signal by amplifying a third voltage of the third bit line when the memory cell is read, receives the third stop signal, and drops the third voltage to the ground potential when the voltage of the third stop signal reaches the threshold; and
a determination circuit which outputs a determination result that is obtained by determining a logical value of data stored in the memory cell based on a difference between a time at which a first detection signal, which is generated based on the first amplified signal and the second amplified signal, changes and a time at which a second detection signal, which is generated based on the third amplified signal, changes.

13. The semiconductor storage device according to claim 12, wherein the first detection signal is a signal whose logic level changes a predetermined time after the first amplified signal generated by the first read circuit connected to the first reference cell or the second amplified signal generated by the second read circuit connected to the first reference cell rises and reaches a predetermined magnitude.

14. The semiconductor storage device according to claim 12, wherein the third stop signal is a signal whose logic level rises when a logic level of at least one of the first stop signal and the second stop signal rises.

15. The semiconductor storage device according to claim 12,
wherein, when the second detection signal changes earlier than the first detection signal, the determination circuit outputs the determination result that indicates the second logical value, and
wherein, when the first detection signal changes earlier than the second detection signal, the determination circuit outputs the determination result that indicates the first logical value.

16. The semiconductor storage device according to claim 12, wherein the determination circuit includes:
a determination unit which outputs a control signal that indicates the difference;
a first n-channel type MOSFET whose drain voltage indicates the determination result, whose source voltage indicates the ground potential, and whose on and off are controlled by the control signal; and
a circuit unit which raises the drain voltage in advance before the determination unit outputs the control signal.

17. The semiconductor storage device according to claim 16,
wherein each of the first read circuit, the second read circuit, and the third read circuit includes an amplifier circuit that generates a corresponding one of the first amplified signal, the second amplified signal, and the third amplified signal,
wherein the amplifier circuit includes:
a fourth capacitor having one end connected to a corresponding one of the first bit line, the second bit line, and the third bit line;
a first inverter having a first input terminal connected to another end of the fourth capacitor;
a fifth capacitor having one end connected to a first output terminal of the first inverter;
a second inverter that has a second input terminal connected to another end of the fifth capacitor and that outputs a corresponding one of the first amplified signal, the second amplified signal, and the third amplified signal;
a second n-channel type MOSFET having a drain connected to the first output terminal of the first inverter and a source connected to ground; and
a third inverter having a third input terminal connected to the drain of the second n-channel type MOSFET and a third output terminal connected to a gate of the second n-channel type MOSFET,
wherein the circuit unit raises the drain voltage in advance before the determination unit outputs the control signal based on an output signal of the third inverter.

18. The semiconductor storage device according to claim 12, wherein
the first read circuit is provided in a pair and the second read circuit is provided in a pair, and
the first detection signal is generated based on a pair of first amplified signals and a pair of second amplified signals.

19. A read method of a semiconductor storage device, the read method comprising:
generating, by a first read circuit connected via a first bit line to a first reference cell that is read when a memory cell is read, a first amplified signal by amplifying a first voltage of the first bit line when the memory cell is read and outputting a stop signal that is obtained by delaying the first amplified signal, the first reference cell including a first capacitor that accumulates charges of a first charge amount corresponding to data of a second logical value, reading of which causes a voltage of a third bit line to change more quickly than reading of data of a first logical value, the memory cell including a second capacitor that accumulates charges of a second charge amount corresponding to the data of the first logical value or the data of the second logical value;
generating, by a second read circuit connected via a second bit line to a second reference cell that is read when the memory cell is read, a second amplified signal by amplifying a second voltage of the second bit line when the memory cell is read, receiving the stop signal, and dropping the second voltage to a ground potential when a voltage of the stop signal reaches a threshold, the second reference cell including a third capacitor that accumulates charges of a third charge amount corresponding to the data of the first logical value;
generating, by a third read circuit connected to the memory cell via the third bit line, a third amplified signal by amplifying a third voltage of the third bit line when the memory cell is read, receiving the stop signal, and dropping the third voltage to the ground potential when the voltage of the stop signal reaches the threshold; and
outputting, by a determination circuit, a determination result that is obtained by determining a logical value of data stored in the memory cell based on a potential difference between the first amplified signal and the third amplified signal and a potential difference between the second amplified signal and the third amplified signal.

* * * * *